(12) United States Patent
Lee et al.

(10) Patent No.: US 8,643,080 B2
(45) Date of Patent: Feb. 4, 2014

(54) THREE-DIMENSIONAL SEMICONDUCTOR MEMORY DEVICE

(75) Inventors: Changhyun Lee, Suwon-si (KR); Byoungkeun Son, Suwon-si (KR); Youngwoo Park, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 38 days.

(21) Appl. No.: 13/217,416

(22) Filed: Aug. 25, 2011

(65) Prior Publication Data

US 2012/0068247 A1 Mar. 22, 2012

(30) Foreign Application Priority Data

Sep. 17, 2010 (KR) ........................ 10-2010-0092000

(51) Int. Cl.
- *H01L 29/788* (2006.01)
- *H01L 29/792* (2006.01)
- *H01L 21/06* (2006.01)
- *H01L 21/336* (2006.01)

(52) U.S. Cl.
USPC ........... 257/316; 257/315; 257/326; 438/102; 438/268

(58) Field of Classification Search
USPC ............. 257/314, 316, 315, 326; 365/185.17; 438/102, 268
See application file for complete search history.

(56) References Cited

U.S. PATENT DOCUMENTS

| | | | | |
|---|---|---|---|---|
| 2007/0158736 | A1* | 7/2007 | Arai et al. | 257/315 |
| 2007/0184615 | A1* | 8/2007 | Brazzelli et al. | 438/266 |
| 2008/0067583 | A1* | 3/2008 | Kidoh et al. | 257/326 |
| 2008/0253187 | A1* | 10/2008 | Aritome | 365/185.17 |
| 2008/0265236 | A1* | 10/2008 | Lee et al. | 257/3 |
| 2009/0141547 | A1* | 6/2009 | Jin et al. | 365/163 |

FOREIGN PATENT DOCUMENTS

KR 20080096030 * 9/2009 ............ H01L 21/336

OTHER PUBLICATIONS

Jang et al., Vertical Cell Array using TCAT (Terabit Cell Array Transistor) Technology for Ultra High Density NAND Flash Memory, Symposium on VLSI Technology, Digest of Technical Papers, pp. 192-193 (2009).

* cited by examiner

*Primary Examiner* — Long K Tran
*Assistant Examiner* — Dzung Tran
(74) *Attorney, Agent, or Firm* — F. Chau & Associates, LLC

(57) ABSTRACT

Provided are three-dimensional semiconductor devices. The devices may include gap-fill insulating patterns configured to upwardly extend from a substrate and an electrode structure defined by sidewalls of the gap-fill insulating patterns. Vertical structures may be provided between adjacent ones of the gap-fill insulating patterns to penetrate the electrode structure, and the vertical structures may include first and second rows of the vertical structures. A separation pattern may be provided between the first and second rows of vertical structures and include a separation semiconductor layer. The separation pattern extends along a direction parallel to the first and second rows of vertical structures.

19 Claims, 34 Drawing Sheets

THREE-DIMENSIONAL SEMICONDUCTOR MEMORY DEVICE

CROSS-REFERENCE TO RELATED APPLICATIONS

This U.S. non-provisional patent application claims priority under 35 U.S.C. §119 to Korean Patent Application No. 10-2010-0092000, filed on Sep. 17, 2010, in the Korean Intellectual Property Office, the entire contents of which are herein incorporated by reference.

BACKGROUND

Embodiments of the inventive concept relate generally to semiconductor devices, and more particularly, to three-dimensional (3D) semiconductor memory devices including three-dimensionally arranged memory cells.

A 3D-IC memory fabrication process that has memory cells stacked in 3 dimensions may be used to increase memory capacity.

The 3D-IC memory fabrication process includes a punch-and-plug process in which multiple thin layers are sequentially stacked on a substrate and then penetrated to form plugs. The punch-and-plug process may increase memory capacity without a drastic increase in manufacturing costs.

SUMMARY

Exemplary embodiments of the inventive concept may provide high-capacity storage three-dimensional semiconductor devices with an electrode structure fabricated by a simple process and methods of fabricating a three-dimensional semiconductor device capable of removing a sacrificial layer as well as forming an electrode structure in a stable manner.

According to an exemplary embodiment of the inventive concept, a three-dimensional semiconductor device may include a substrate, gap-fill insulating patterns on the substrate, an electrode structure defined by sidewalls of the gap-fill insulating patterns, vertical structures provided between adjacent gap-fill insulating patterns of the gap-fill insulating patterns to penetrate the electrode structure, the vertical structures including first and second rows of the vertical structures, and a separation pattern provided between the first and second rows of vertical structures, the separation pattern including a separation semiconductor layer. The separation pattern extends along a direction parallel to the first and second rows of vertical structures.

According to an embodiment, a width of the separation pattern may be smaller than a width of the gap-fill insulating pattern.

According to an embodiment, the vertical structures may be provided in channel holes penetrating the electrode structure, wherein each of them may include a vertical semiconductor layer filling at least a portion of a corresponding channel hole.

According to an embodiment, the separation pattern may be provided in a first trench exposing the substrate along the direction parallel to the first and second rows of vertical structures, wherein the separation semiconductor layer fills at least a portion of the first trench.

According to an embodiment, as viewed from above the separation pattern, the separation pattern may be shaped as circles partially overlapping each other along the direction parallel to the first and second rows of vertical structures.

According to an embodiment, the device may further include a first doped region provided along the separation pattern on a top portion of the separation pattern. The device may further include a second doped region provided in the substrate under the separation pattern, and the second doped region has the same conductivity type as the first doped region. The first and second doped regions have the same conductivity type as the substrate and a higher doping concentration than a doping concentration of the substrate.

According to an embodiment, the device may further include a third doped region formed in the substrate under the gap-fill insulating pattern, and a fourth doped region provided on a top portion of the vertical structure. The first, second, third and fourth doped regions have the same conductivity type.

According to an embodiment, the device may further include a memory layer disposed between the electrode structure and the vertical structure, the electrode structure may include electrodes and insulating layers alternately stacked. The memory layer may be provided between the separation pattern and the electrodes and separates the separation pattern from the electrodes electrically.

According to an embodiment, the separation pattern penetrates at least one of the electrodes and a bottom surface of the separation pattern may be spaced apart from a top surface of the substrate.

According to an embodiment, the electrodes may include word lines and a gate electrode of a string selection transistor disposed on top of the word lines, wherein a bottom surface of the separation pattern may be positioned at a lower level than a bottom surface of the gate electrode of the string selection transistor.

According to an exemplary embodiment of the inventive concept, a three-dimensional semiconductor device may include electrodes sequentially stacked on a substrate, vertical structures extending upwardly from the substrate to penetrate the electrodes, the vertical structures being two-dimensionally arranged on the substrate, separation patterns extending along a first direction parallel to a top surface of the substrate, wherein each of the separation patterns includes a separation semiconductor layer, and gap-fill insulating patterns extending parallel to the separation patterns. The separation patterns and the gap-fill insulating patterns may be alternately disposed between the vertical structures disposed along a second direction crossing the first direction.

According to an embodiment, a distance in the second direction between a separation pattern and a vertical structure that are adjacent to each other may be less than a distance in the second direction between a gap-fill insulating pattern and a vertical structure that are adjacent to each other.

According to an exemplary embodiment of the inventive concept, there is provided a semiconductor device comprising a substrate, a plurality of horizontal structures sequentially stacked on a top surface of the substrate, a row of vertical structures penetrating the horizontal structures in a first direction perpendicular to the top surface of the substrate, wherein the vertical structures are spaced apart from each other in a second direction parallel to the top surface of the substrate, a separation pattern penetrating at least one of the horizontal structures in the first direction, wherein the separation pattern extends in the second direction, and a gap-fill insulating pattern penetrating the horizontal structures in the first direction, wherein the gap-fill insulating pattern extends in the second direction, and wherein the row of vertical structures, the separation pattern, and the gap-fill insulating pattern are arranged in parallel to each other in a third direction parallel to the top surface of the substrate and perpendicular to the second direction.

According to an embodiment, the separation pattern penetrates all of the horizontal structures or only a horizontal structure located farthest from the substrate.

According to an embodiment, each of the vertical structures includes a vertical semiconductor layer and a vertical gap-fill layer sequentially formed on an inner wall, and the separation pattern includes a separation semiconductor layer and a separation insulating layer sequentially formed on an inner wall.

According to an embodiment, each of the vertical structures includes a vertical pattern, a spacer, a vertical semiconductor layer, and a vertical gap-fill layer sequentially formed on an inner wall, and the separation pattern includes a vertical separation pattern, a spacer separation pattern, a separation semiconductor layer, and a separation insulating layer sequentially formed on an inner wall.

BRIEF DESCRIPTION OF THE DRAWINGS

Exemplary embodiments will be more clearly understood from the following brief description taken in conjunction with the accompanying drawings.

FIG. 1 is a circuit diagram of a three-dimensional semiconductor memory device according to an embodiment of the inventive concept;

FIGS. 2 through 11 are perspective views or a sectional view illustrating three-dimensional semiconductor devices and methods of fabricating the same according to an exemplary embodiment of the inventive concept;

FIGS. 12 through 20 are perspective views illustrating three-dimensional semiconductor devices and methods of fabricating the same according to an embodiment of the inventive concept;

FIGS. 21 through 28 are perspective views illustrating structures of a memory layer according to an embodiment of the inventive concept;

FIGS. 29 through 34 are perspective views illustrating three-dimensional semiconductor devices and methods of fabricating the same according to an embodiment of the inventive concept;

FIG. 35 is a schematic block diagram illustrating an example of a memory system including a three-dimensional semiconductor memory device according to an embodiment of the inventive concept;

FIG. 36 is a block diagram illustrating an example of a memory card including a three-dimensional semiconductor memory device according to an embodiment of the inventive concept; and FIG. 37 is a block diagram illustrating an example of an information processing system including a three-dimensional semiconductor memory device according to an embodiment of the inventive concept.

DETAILED DESCRIPTION

Figure 1:
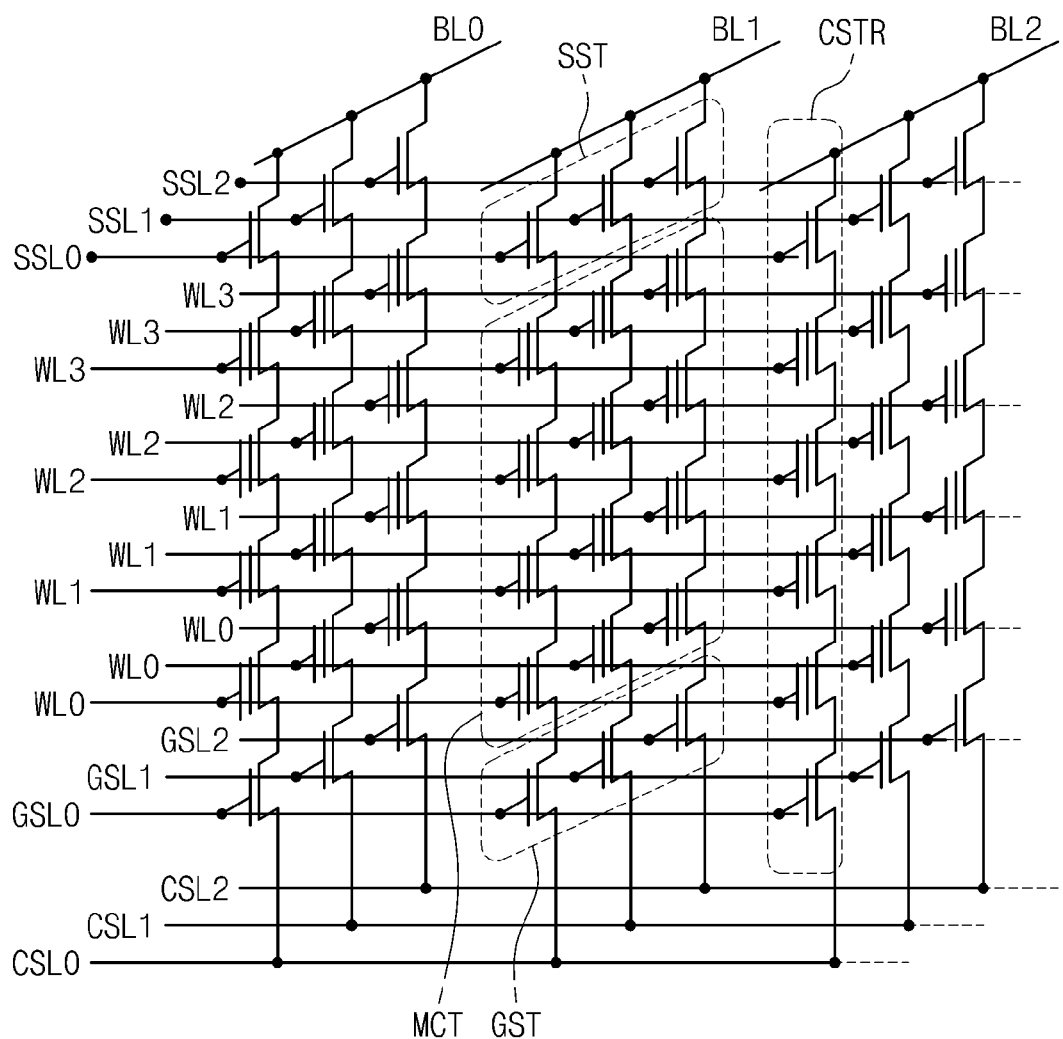
FIGS. 1 through 37 represent non-limiting, exemplary embodiments as described herein.

Exemplary embodiments of the inventive concept will now be described more fully with reference to the accompanying drawings, wherein Like reference numerals may denote like or similar elements throughout the specification and the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

A three-dimensional semiconductor device according to exemplary embodiments of the inventive concept may include a cell array region, a peripheral circuit region, a sense amp region, a decoding circuit region and a connection region. A plurality of memory cells and bit lines and word lines for electrical connection to the plurality of memory cells may be in the cell array region. Circuits for driving the plurality of memory cells may be in the peripheral circuit region, and circuits for reading information stored in the plurality of memory cells may be in the sense amp region. The connection region may be between the cells array region and the decoding circuit region, and a wiring structure for electrically connecting the word lines with the decoding circuit region may be between the word lines and the decoding region.

FIG. 1 is a circuit diagram of a three-dimensional semiconductor memory device according to an embodiment of the inventive concept.

Referring to FIG. 1, according to an embodiment of the inventive concept, a cell array of the three-dimensional semiconductor memory device may include common source lines CSL0, CSL1, and CSL2, bit lines BL0, BL1, and BL2, and cell strings CSTR interposed between the common source line CSL0, CSL1, and CSL2 and the bit lines BL0 to BL2.

The bit lines BL0 to BL2 may be two-dimensionally arranged and plural ones of the cell strings CSTR may be connected in parallel to each of the bit lines BL. Plural ones of the cell strings CSTR may be connected in common to a corresponding one of the common source lines CSL0 to CSL2. Plural ones of the cell strings CSTR may be disposed between the bit lines BL0 to BL2 and each of the common source lines CSL0 to CSL2. According to an embodiment, the common source lines CSL0 to CSL2 may be connected with one another in an equipotential state. According to an embodiment, the common source lines CSL0 to CSL2 may be separated from one another and may be controlled independently from one another.

Each of the cell strings CSTR may include a ground selection transistors GST coupled to a corresponding one of the common source lines CSL0 to CSL2, a string selection transistors SST coupled to a corresponding one of the bit lines BL0 to BL2, and a plurality of memory cell transistors MCT disposed between the ground selection transistors GST and the string selection transistors SST. The plurality of the memory cell transistors MCT may be connected in series between the ground selection transistor GST and the string selection transistor SST.

Sources of plural ground selection transistors GST may be connected to respective corresponding common source lines of the common source lines CSL0 to CSL2. Ground selection lines GSL0 to GSL2, word lines WL0 to WL3, and string selection lines SSL0-SSL2 may be disposed between the common source lines CSL0 to CSL2 and the bit lines BL0 to BL2, and may be connected to gate electrodes of the ground selection transistors GST, the memory cell transistors MCT, and the string selection transistors SST, respectively. According to an embodiment, each of the memory cell transistors MCT may include a data storage element.

According to an embodiment, each of the cell string CSTR may include a plurality of the memory cell transistors MCT disposed at different distances from the corresponding common source lines CSL0 to CSL2. As a consequence, there may be a multi-layered word line structure including the word lines WL0 to WL3 disposed at different levels from one another between the common source lines CSL0 to CSL2 and the bit lines BL0 to BL2.

The gate electrodes of the memory cell transistors MCT, which are disposed at the same or substantially the same level from the common source lines CSL0 to CSL2, may be connected in common to one of the word lines WL0 to WL3 such that the gate electrodes of the memory cell transistors MCT are subjected to an equipotential state. Alternatively, although the gate electrodes of the memory cell transistors MCT may be disposed at the same or substantially the same level from the common source lines CSL0 to CSL2, some gate electrodes of the memory cell transistors MCT (e.g., gate electrodes disposed in a row or column) may be electrically and spatially separated from other gate electrodes of the memory cell transistors MCT (e.g., gate electrodes disposed in other rows or columns).

FIGS. 2 through 7 and FIGS. 9 through 11 are perspective views illustrating a three-dimensional semiconductor device and a method of fabricating the three-dimensional semiconductor device according to an exemplary embodiment of the inventive concept. FIG. 8 is a sectional view taken along line I-I' of FIG. 7.

Figure 2:
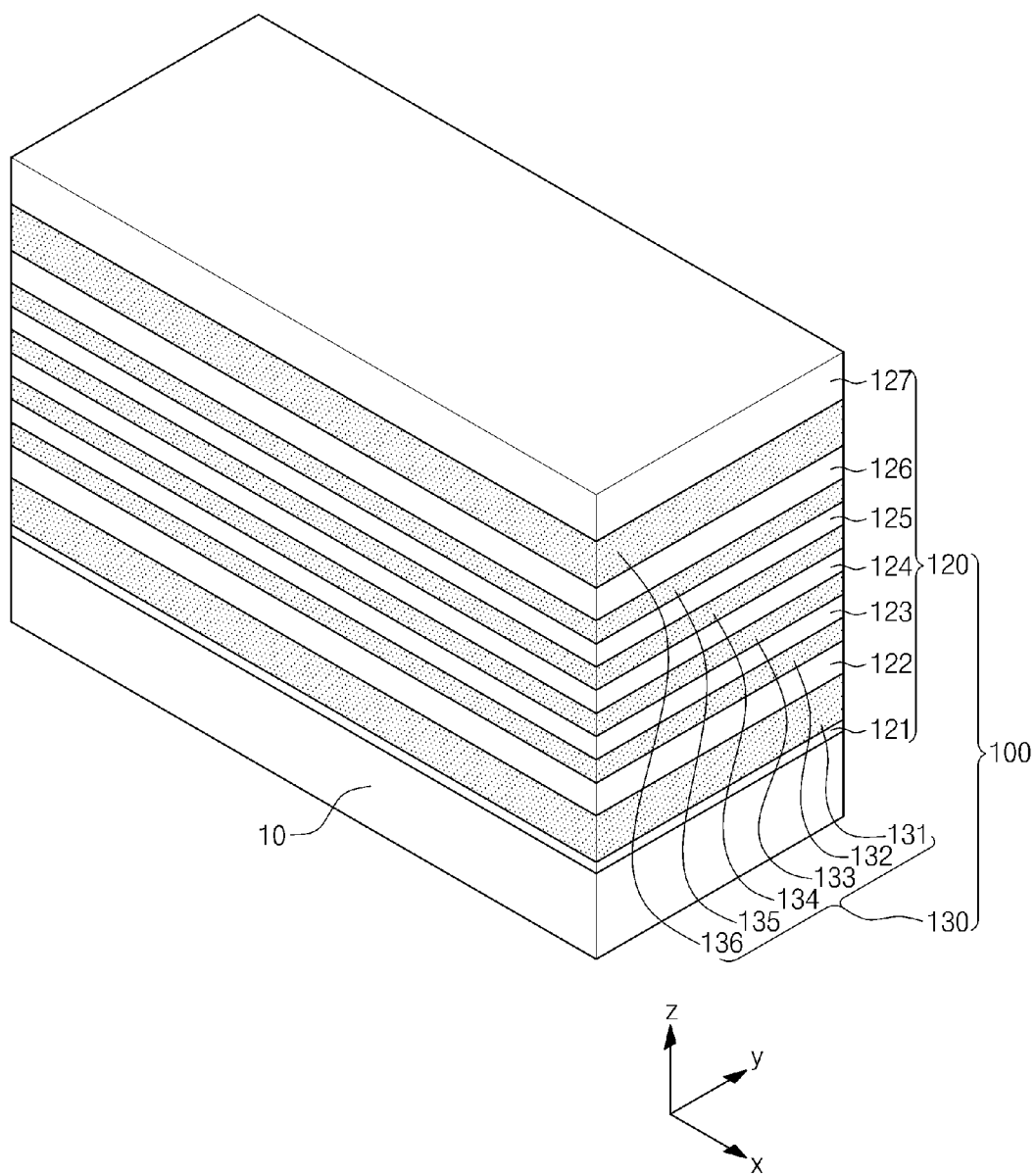

Referring to FIG. 2, a mold structure 100 may be formed on a substrate 10. The substrate 10 may be formed of, for example, a semiconductor, an insulating material, and/or a semiconductor or conductor covered with an insulating material. For example, according to an embodiment, the substrate 10 may be a silicon wafer.

The mold structure 100 may include a sacrificial layer group 130 including sacrificial layers 131-136 and an insulating layer group 120 including insulating layers 121-127. The insulating layers 121-127 and the sacrificial layers 131-136 may be alternately and repeatedly stacked as shown in the drawings. Hereinafter, for ease of description, each of the insulating layers 121-127 of the insulating layer group 120 may also be collectively denoted as an "insulating layer 120" in the drawings, and each of the sacrificial layers 132-138 of the sacrificial layer group 130 may also be collectively denoted as a "sacrificial layer 130".

The sacrificial layers 130 and the insulating layers 120 may be formed of materials having an etch selectivity to each other. For instance, the insulating layer 120 may include a material that is etched at a slower rate than a material of the sacrificial layer 130 with respect to a sacrificial material etchant. The etch selectivity may be quantitatively expressed as a ratio of an etch rate of the sacrificial layers 130 to an etch rate of the insulating layers 120. For instance, the sacrificial layers 130 may include a material having an etch selectivity of between 1:10 and 1:200 (more specifically, 1:30 to 1:100) with respect to the insulating layers 120. According to an embodiment, the insulating layer 120 may include at least a layer formed of silicon oxide or silicon nitride, and the sacrificial mold layer 130 may include at least a layer, which may be formed of silicon, silicon oxide, silicon carbide, or silicon nitride and which may be different from a material constituting the insulating layers 120. For easy understanding, exemplary embodiments of the inventive concept in which insulating layers 120 and the sacrificial layers 130 are formed of silicon oxide and silicon nitride, respectively, will be described hereinafter.

According to an embodiment, some or all of the sacrificial layers 130 may have different thicknesses. For instance, according to an embodiment, an uppermost and lowermost sacrificial layers of the sacrificial layers 130 (for example, the sacrificial layers 136 and 131) may be thicker than the other sacrificial layers 130 (for example, the sacrificial layers 132-135) between the uppermost and lowermost sacrificial layers. According to an embodiment, some or all the insulating layers 120 may have different thicknesses. For instance, according to an embodiment, a second uppermost and second lowermost insulating layers of the insulating layers 120 (for example, the insulating layers 126 and 122) may be thicker than the other insulating layers 120 (for example, the insulating layers 123-125) between the second uppermost and second lowermost insulating layers. The lowermost insulating layer 121 may be thinner than the insulating layers 123-125. The uppermost insulating layer 127 may be thicker than the second uppermost and second lowermost insulating layers 126 and 122.

According to embodiments, thicknesses of the insulating layers 120 and the sacrificial layers 130 may be modified by those skilled in the art, and the number of layers included in the mold structure 100 may be modified by those skilled in the art.

Figure 3:
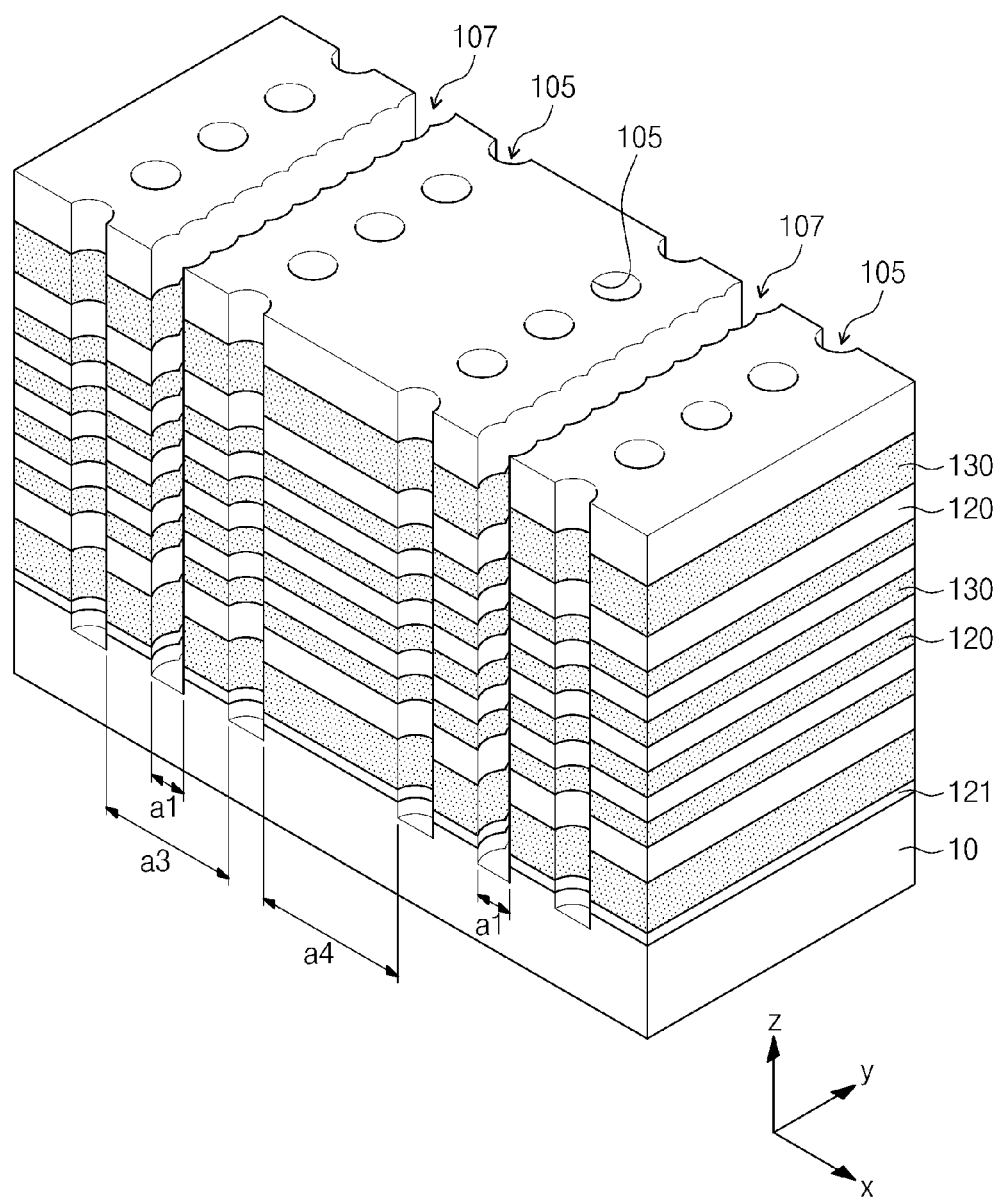

Referring to FIG. 3, channel holes 105 and first trenches 107 may be formed in the mold structure 100. The channel holes 105 may be formed to penetrate the mold structure 100. Each of the channel holes 105 may be formed to have a circular cross section. Each of the channel holes 105 may have a depth that is at least five times greater than a width of the channel hole. The channel holes 105 may be two-dimensionally arranged on a top surface (for example, an xy-plane) of the substrate 10. For example, according to an embodiment, each of the channel holes 105 may be an isolated region spaced apart from the other channel holes 105 along x and y directions.

The first trenches 107 may have an elongated shape along the y-direction. The first trenches 107 may be formed at a first side of a row of channel holes 105 arranged along the y-direction, and may not be formed at a second side of the row of channel holes 105, which is opposite to the first side with respect to the row of channel holes 105. For instance, according to an embodiment, the channel holes 105 may be arranged in a plurality of rows, so that the first trenches 107 may be formed between first and second rows of the channel holes 105, but may not be formed between the second and third rows of the channel holes 105. As viewed from above the first trenches 107, for example, in the direction of −z axis, the first trenches 107 may be shaped as circles partially overlapping each other along the y-direction. An x-directional width a1 of the first trench 107 may be greater than or equal to a diameter of the channel hole 105. Hereinafter, a width a1 of the first trench 107 may correspond to a shortest distance between inner sidewalls of the first trenches 107.

In the x-direction, distances between the channel holes 105 may be different from each other. For example, a distance a3 between a first pair of channel holes 105 formed at two opposite sides of a first trench 107 may be less than a distance a4 between a second pair of channel holes 105 without any intervening first trench 107 between the second pair of channel holes 105.

The channel holes 105 and the first trenches 107 may be formed using the same process. The formation of the channel holes 105 and the first trenches 107 may include forming a mask pattern defining positions of the channel holes 105 and the first trenches 107 on the mold structure 100 and anisotropically etching the mold structure 100 using the mask pattern as an etch mask. Since the mold structure 100 includes layers formed of at least two different materials, sidewalls of the channel holes 105 and the first trenches 107 may not be exactly perpendicular to the top surface of the substrate 10. For instance, according to an embodiment, each of the channel holes 105 and the first trenches 107 may have a downwardly tapered shape.

As shown in FIG. 3, the channel holes 105 and the first trenches 107 may be formed to expose the top surface of the substrate 10. During the anisotropic etching of the mold structure 100, the substrate 10 may be recessed to a predetermined depth under the channel holes 105 and the first trenches 107.

Figure 4:
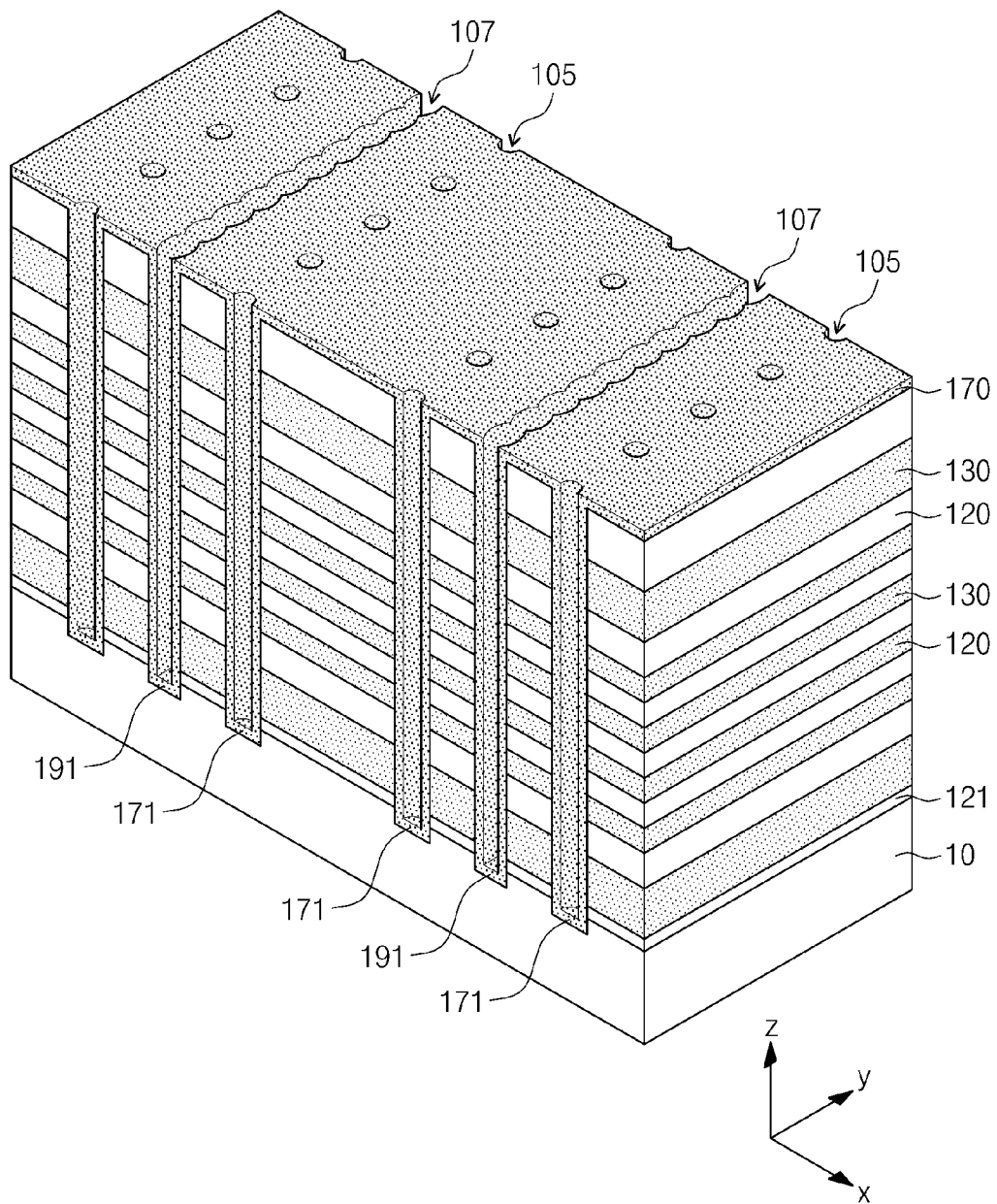

Referring to FIG. 4, a semiconductor layer 170 may be formed to cover inner walls of the channel holes 105 and the first trenches 107. Hereinafter, a portion of the semiconductor layer 170 disposed in the first trench 107 will be referred to as a separation semiconductor layer 191, and a portion of the semiconductor layer 170 disposed in the channel hole 105 will be referred to as a vertical semiconductor layer 171. According to an embodiment, the semiconductor layer 170 may be a polysilicon layer, which may be formed using an atomic layer deposition (ALD) or chemical vapor deposition (CVD) process. The semiconductor layer 170 may be formed to have a thickness ranging from about 1/50 to 1/5 of a width of the channel hole 105. According to embodiments of the inventive concept, the semiconductor layer 170 may include one of an organic semiconductor layer and a carbon nano structure. According to an embodiment, the semiconductor layer 170 may be conformally formed to have such a thickness as not to completely fill the channel holes 105 and the first trenches 107.

Figure 5:
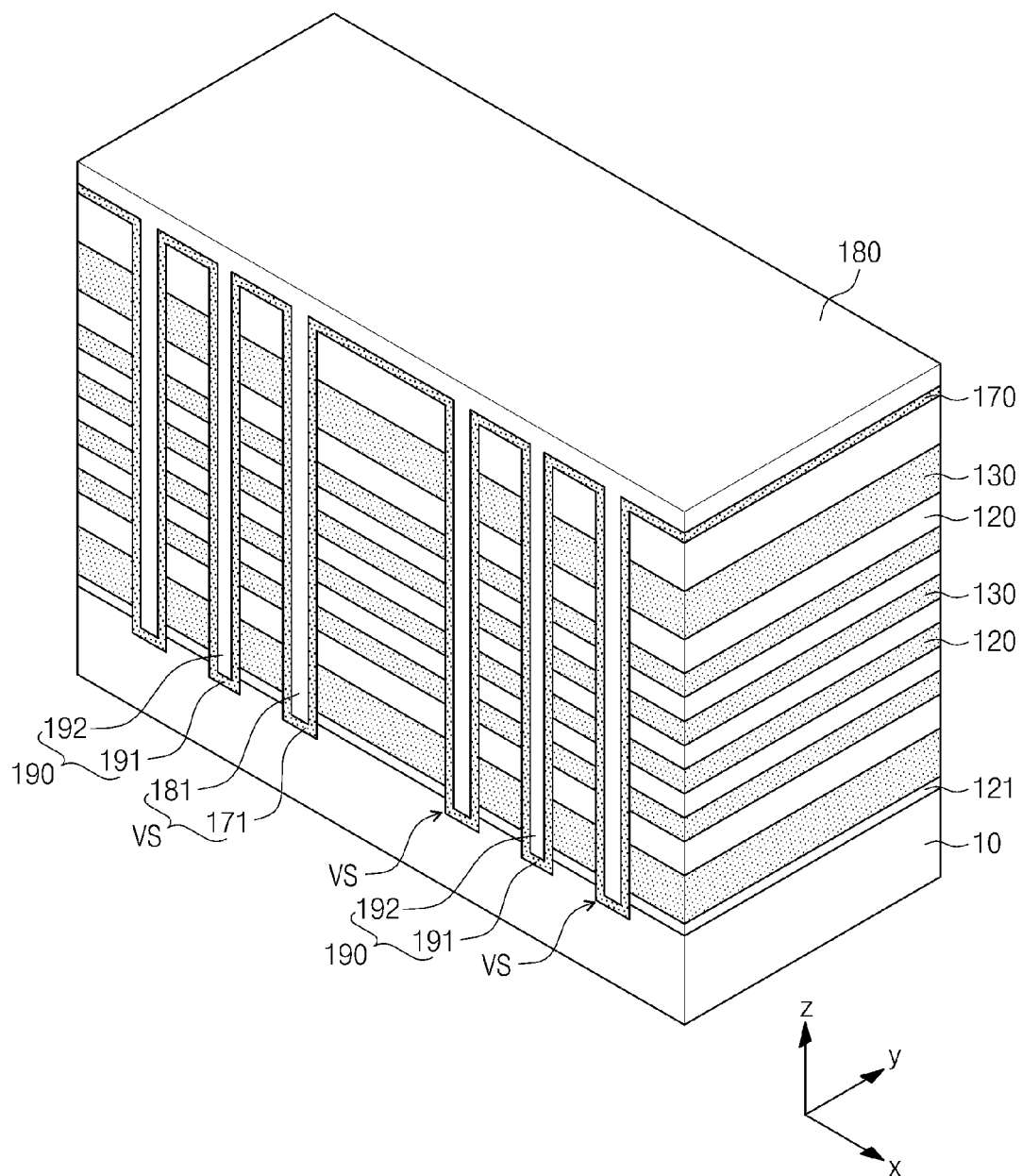

Referring to FIG. 5, a gap-fill layer 180 may be formed on the resultant structure provided with the semiconductor layer 170 to fill the channel holes 105 and the first trenches 107. Hereinafter, a portion of the gap-fill layer 180 filling the first trench 107 will be referred to as a separation insulating layer 192, and a portion of the gap-fill layer 180 filling the channel hole 105 will be referred to as a vertical gap-fill layer 181. The vertical semiconductor layer 171 and the vertical gap-fill layer 181 may constitute a vertical structure VS, and in the first trenches 107, the separation insulating layer 192 and the separation semiconductor layer 191 may constitute separation patterns 190. The gap-fill layer 180 may be one of an insulating layer, which is formed by a silicon-on-insulator (SOI) method, and a silicon oxide layer. The separation insulating layer 192 and the vertical gap-fill layer 181 may be simultaneously formed, and as a consequence, may be formed of the same material having the same or substantially the same physical properties. Further, the separation semiconductor layer 191 and the vertical semiconductor layer 171 may be simultaneously formed, and as a consequence, may be formed of the same material having the same or substantially the same physical properties. According to an embodiment, before the formation of the gap-fill layer 180, a hydrogen annealing process may be further performed in a gas atmosphere containing hydrogen and deuterium to thermally treat the structure shown in FIG. 4, which has the semiconductor layer 170. The hydrogen annealing process may cure crystal defects that may exist in the semiconductor layer 170.

According to embodiments of the inventive concept, the semiconductor layer 170 may be formed to fill the channel holes 105 and the first trenches 107, so that the formation of the gap-fill layer 180 may be omitted.

Figure 6:
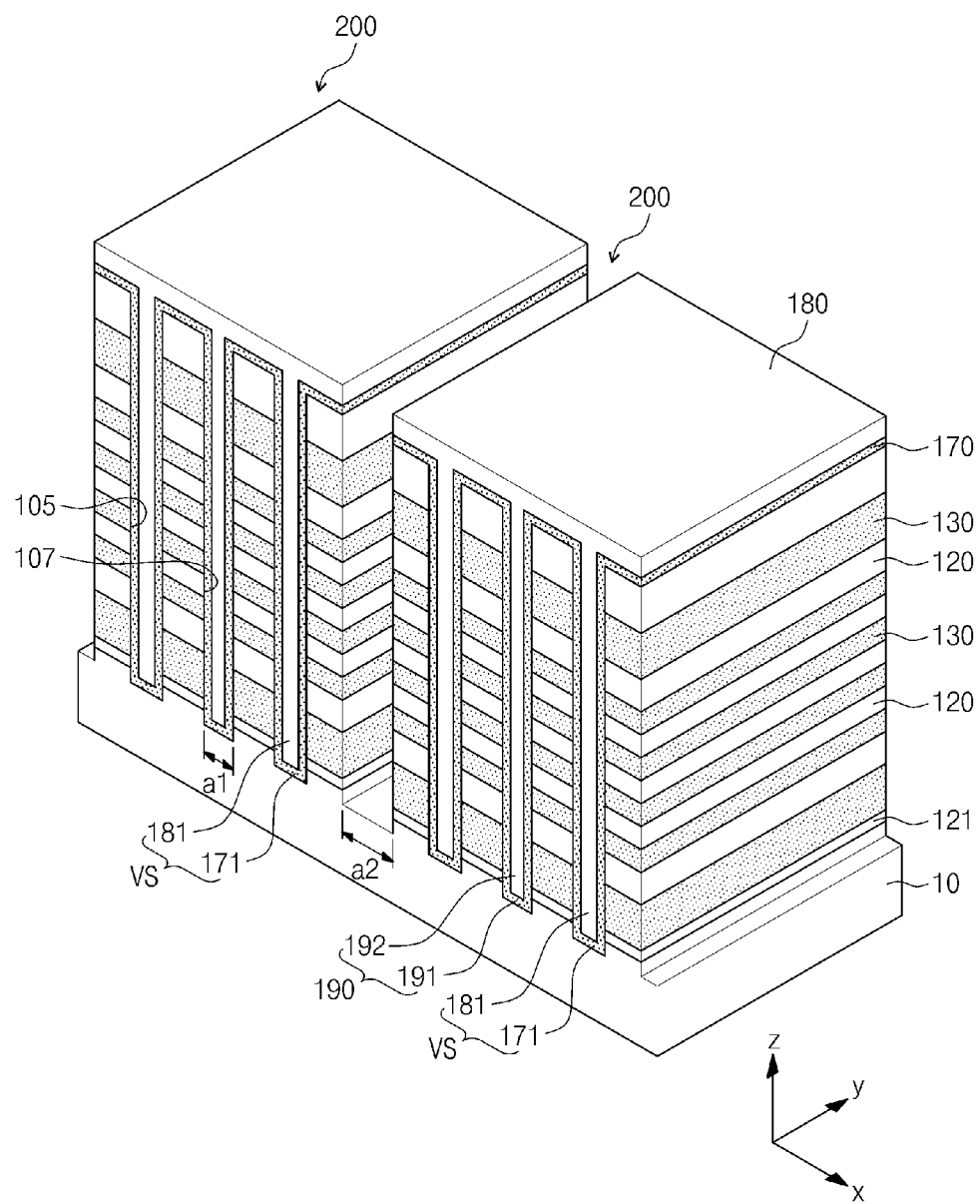

Referring to FIG. 6, second trenches 200 that expose the substrate 10 may be formed by patterning the mold structure 100. The second trench 200 may be formed at a side of a row of channel holes 105 arranged along the y-direction. For example, a row of channel holes 105 may be interposed between a first trench 107 and a second trench 200. For instance, in the case that the channel holes 105 may be arranged in a plurality of rows, the second trenches 200 may be formed between second and third rows, but may not be formed between first and second rows. As a result, in the x-direction, the first trenches 107 and the second trenches 200 may be alternately formed between the rows of the channel holes 105.

The formation of the second trenches 200 may include forming an etch mask on an upper portion of the mold structure 100 or the gap-fill layer 180 and anisotropically etching the layers under the etch mask to expose a top surface of the substrate 10. The top surface of the substrate 10 exposed by the second trenches 200 may be recessed to a predetermined depth, as shown in the FIG. 6, during the anisotropic etching step.

The second trenches 200 may be formed to have an x-directional width a2. According to an embodiment, the width a2 may be greater than the width a1 of the first trench 107, so that subsequent processes for removing the sacrificial layers 130 and forming gate electrodes may be easily performed. Unlike that shown in the FIG. 6, the second trenches 200 may sometimes have a downwardly tapered shape as a result of the etching process, so that the second trenches 200 may be formed to be wide enough to facilitate the removal of the sacrificial layers 130 and the formation of the gate electrodes. According to embodiments of the inventive concept, the rows of the channel holes 105 may be disposed between the first and the second trenches 107 and 200 alternately formed. Since the first trenches 107 may have a smaller width (for example, width a1) than the second trench 200 as described above, an x-directional width of the mold structure 100 may be reduced.

Figure 7:
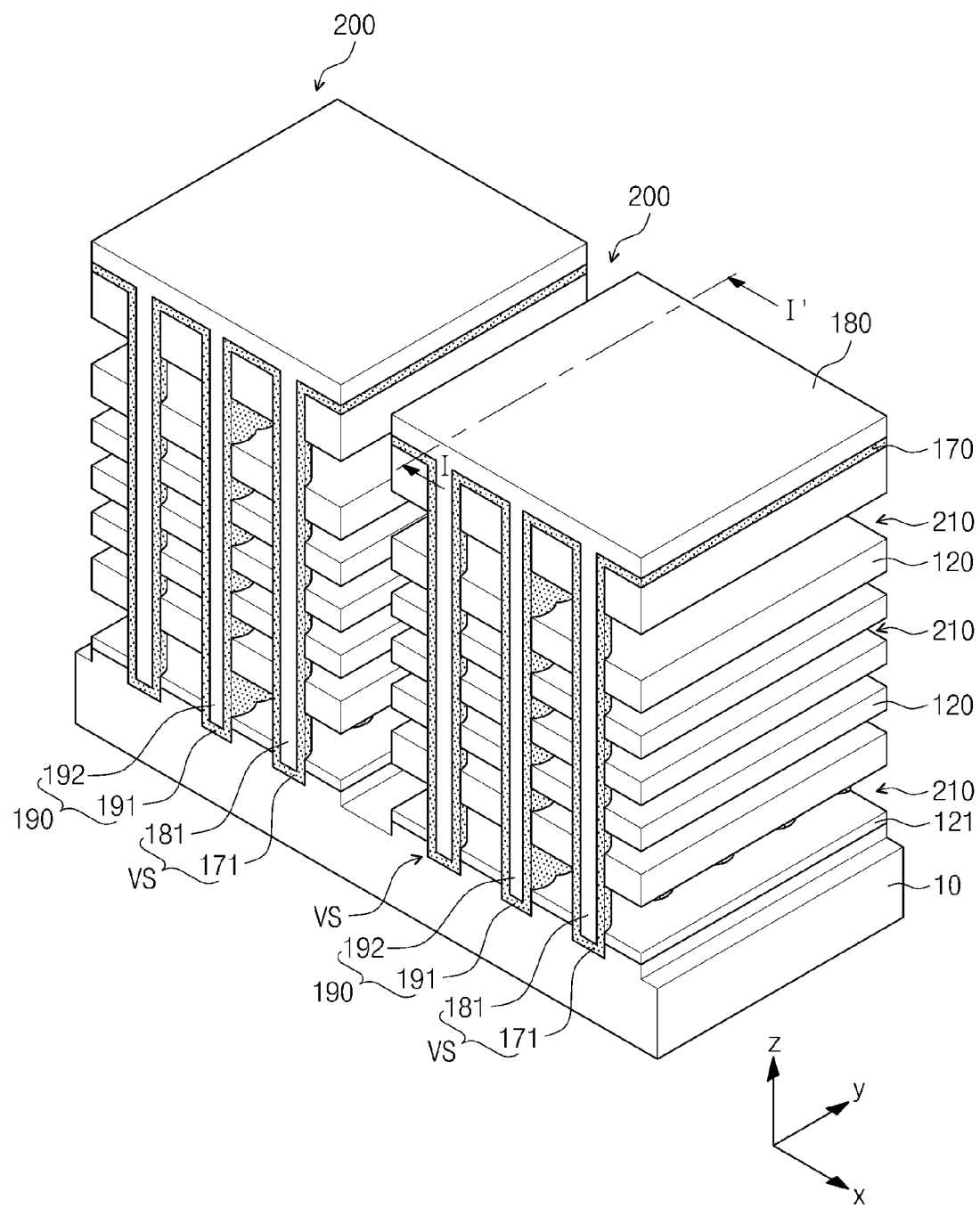
Figure 8:
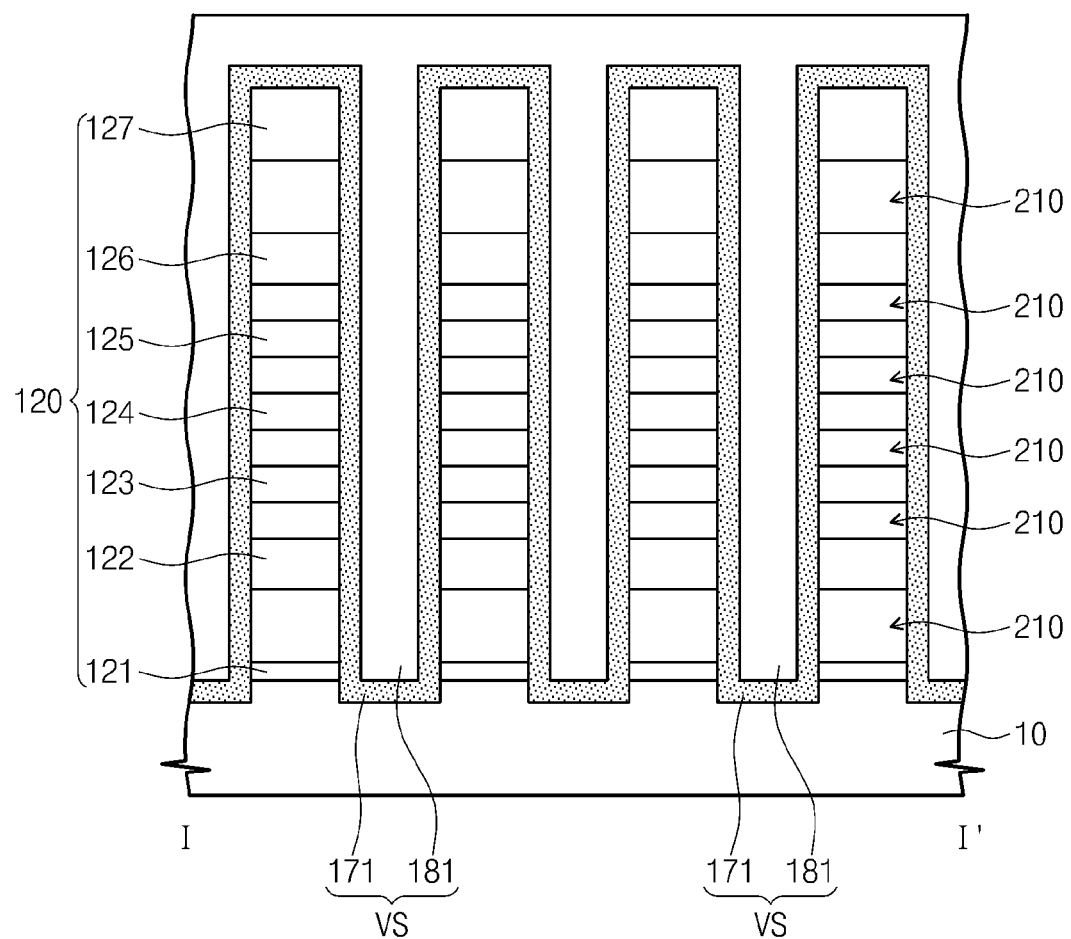

Referring to FIGS. 7 and 8, recess regions 210 may be formed by selectively removing the sacrificial layers 130 exposed by the second trenches 200. FIG. 8 is a sectional view taken along line I-I' of FIG. 7. The recess regions 210 may be gap regions laterally extending from the second trenches 200 and may expose sidewalls of the vertical semiconductor layers 171 and the separation semiconductor layers 191. An outer boundary of the recess region 210 may be defined by the insulating layers 120 and the second trenches 200, and an inner boundary of the recess region 210 may be defined by the vertical semiconductor layer 171 and the separation semiconductor layer 191.

The formation of the recess regions 210 may include horizontally etching the sacrificial layers 130 using an etch recipe or etchant having an etch selectivity to the insulating layers 120 and the semiconductor layer 170. For instance, according to an embodiment, in the case that the sacrificial layers 130 are formed of silicon nitride and the insulating layers 120 are formed of silicon oxide, the horizontal etching of the sacrificial layers 130 may be performed using a wet etchant containing a phosphoric acid.

Portions of the sacrificial layers 130, which are interposed between the vertical structures VS and the separation patterns 190 that are adjacent to each other, can be etched through portions of the recess regions 210 shown in FIG. 8, which are positioned between the vertical structures VS arranged along the y-direction. For example, a wet etchant can be delivered from the second trenches 200 to a sidewall of the separation pattern 190 through spaces between the vertical structures VS spaced apart from each other in the y direction. As a result, the portions of the sacrificial layers 130 interposed between the vertical structures VS and the separation patterns 190 can be removed during the formation of the recess regions 210.

Each of the separation patterns 190 may be connected to the top surface of the substrate 10 and may have an elongated shape along the y-direction. As a consequence, after the removal of the sacrificial layers 130, the separation patterns 190 and the vertical structures VS may structurally support the mold structure 100. For instance, an external force (e.g., a gravitational force) exerted on the mold structure 100 may be dispersed by the vertical structures VS and the separation patterns 190. As a result, the removal of the sacrificial layers 130 and a subsequent process of forming electrodes may be stably performed.

Figure 9A:
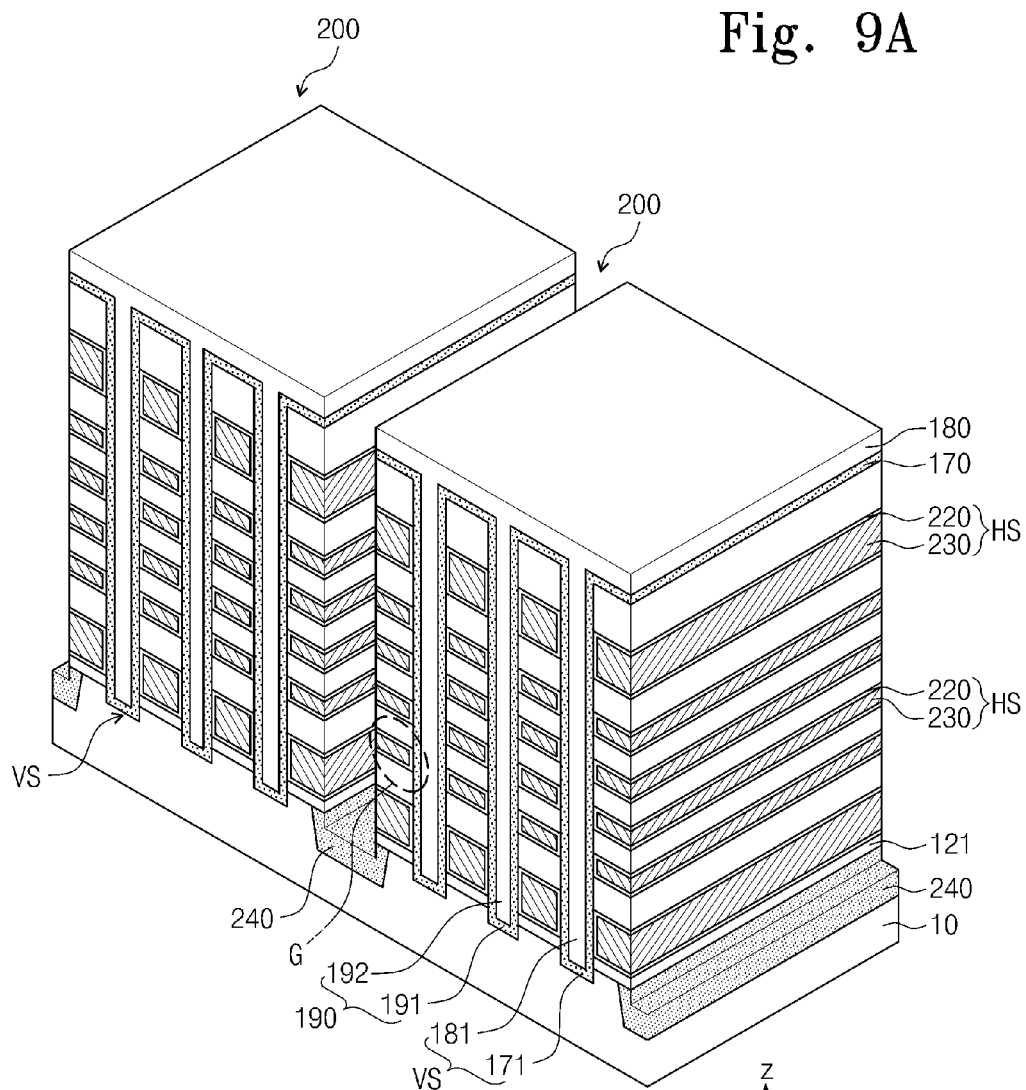
Figure 9B:
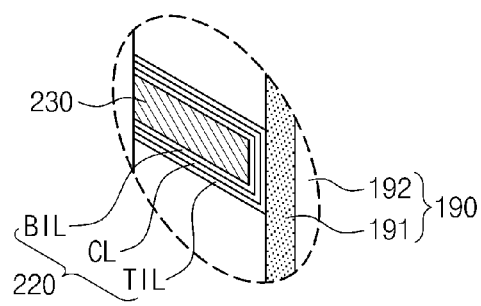

Referring to FIGS. 9A and 9B, horizontal structures HS may be formed to fill the recess regions 210. FIG. 9B is an enlarged view of a region G of FIG. 9A. Each of the horizontal structures HS may include a memory layer 220 covering an inner wall of the recess region 210 and a conductive pattern 230 filling the remaining space of the recess region 210.

The formation of the horizontal structures HS may include sequentially forming the memory layer 220 and a conductive layer to fill the recess regions 210 and removing the conductive layer from the second trenches 200 to leave the conductive patterns 230 in the recess regions 210. Even in the spacing regions interposed between the vertical structures VS and the separation patterns 190, the memory layers 220 and the conductive patterns 230 may be formed through the spaces between the vertical structures VS spaced apart from each other in the y direction.

According to an embodiment, the memory layer 220 may include a plurality of insulating layers. For instance, according to an embodiment, the memory layer 220 may include a tunnel insulating layer TIL, a charge storing layer CL, and a blocking insulating layer BIL sequentially formed on inner walls of the recess region 210. The formation of the memory layer 220 may be performed using a deposition method, such as CVD or ALD, which has a good step coverage property.

According to an embodiment, the charge storing layer CL may include one or more insulating layers with abundant trap sites and/or one or more insulating layers with nano particles and may be formed, for example, by CVD and/or ALD. For example, according to an embodiment, the charge storing layer CL may include one of a trap insulating layer and/or an insulating layer having a floating gate electrode and/or conductive nano dots. According to an embodiment, the charge storing layer CL may include a silicon nitride layer, a silicon oxynitride layer, a silicon-rich nitride layer, a nano crystalline silicon layer, and/or a laminated trap layer.

The tunnel insulating layer TIL may be formed of a material having a higher band gap than a band gap of the charge storing layer CL, and may be formed by a deposition process, such as CVD and/or ALD. For example, according to an embodiment, the tunnel insulating layer TIL may be a silicon oxide layer. The tunnel insulating layer TIL may undergo a thermal treatment after the deposition process. The thermal treatment process may include, for example, a rapid thermal nitridation (RTN) process and/or an annealing process in an atmosphere including nitrogen and/or oxygen.

The blocking insulating layer BIL may be a single insulating layer. Alternatively, the blocking insulating layer BIL may include first and second blocking insulating layers (not shown). The first and second blocking insulating layers may be formed of different materials, and one of the first and second blocking insulating layers may be formed of a material having a smaller band gap than a band gap of the tunnel insulating layer TIL and a larger band gap than a band gap of the charge storing layer CL. The first and second blocking insulating layers may be formed by, for example, CVD and/or ALD, and at least one of the first and second blocking insulating layers may be formed by wet oxidation. According to an embodiment, the first blocking insulating layer may be formed of a high-k dielectric layer (e.g., an aluminum oxide layer and/or a hafnium oxide layer). The second blocking insulating layer may be formed of, for example, a material having a smaller dielectric constant than a dielectric constant of the first blocking insulating layer. According to an embodiment, the second blocking insulating layer may be a high-k dielectric layer and the first blocking insulating layer may be formed of a material having a smaller dielectric constant than a dielectric constant of the second blocking insulating layer.

The conductive layer may be formed to fill the recess regions 210 covered with the memory layer 220. The second trenches 200 may be fully or partially filled with the conductive layer. The conductive layer may include at least a layer formed of doped silicon, metal, metal nitride, and/or metal silicide. For example, according to an embodiment, the conductive layer may include a tantalum nitride layer and/or a tungsten layer. According to an embodiment, the conductive layer may be formed to conformally cover the inner walls of the second trench 200 without fully filling the second trenches 200, so that the conductive pattern 230 may be formed by removing the conductive layer from the second trench 200 using, for example, an isotropic etching method. According to an embodiment, the conductive layer may be formed to fill the second trench 200, so that the conductive pattern 230 may be formed by removing the conductive layer from the second trench 200 using, for example, an anisotropic etching method. According to an exemplary embodiment of the inventive concept, in the case that the semiconductor device is a FLASH memory, the conductive patterns 230 may have different functions. For instance, the lowermost conductive pattern of the conductive patterns 230 depicted in FIG. 9 may serve as a gate electrode of a lower selection transistor, and the uppermost conductive pattern of the conductive patterns 230 may serve as a gate electrode of an upper selection transistor. The remaining conductive patterns of the conductive patterns 230 may serve as gate electrodes of memory cell transistors.

According to an exemplary embodiment of the inventive concept, in the case that the semiconductor device is a FLASH memory, third doped regions 240 may be formed in the substrate 10 after the forming of the conductive patterns 230. The third doped regions 240 may be formed using an ion implantation process in the substrate 10 exposed by the second trenches 200. According to an embodiment, the third doped regions 240 may have a different conductivity type than a conductivity type of the substrate 10.

According to an embodiment, the third doped regions 240 may be connected to each other and may be in an equipotential state. According to an embodiment, the third doped regions 240 may be electrically separated from each other and have different electric potentials from each other. According to an embodiment, the third doped regions 240 may form a plurality of source groups, each of which includes a plurality of spatially separated third doped regions, wherein the source groups may be electrically separated from each other to have different electric potentials.

Figure 10:
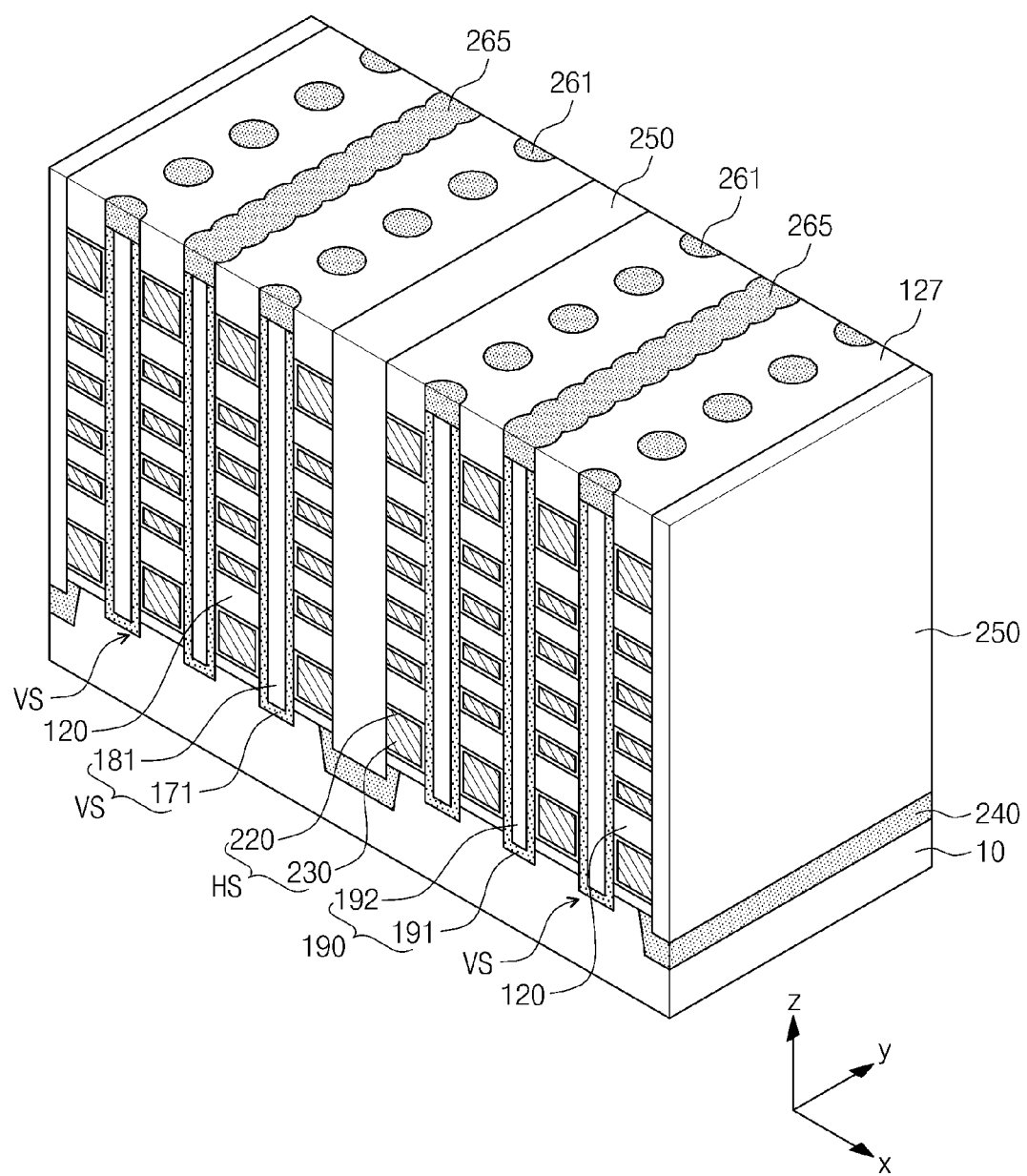

Referring to FIG. 10, gap-fill insulating patterns 250 may be formed to fill the second trenches 200. The formation of the gap-fill insulating pattern 250 may include forming a gap-fill insulating layer (not shown) on the resultant structure provided with the third doped regions 240, for example, the structure shown in FIG. 9, and etching the gap-fill insulating layer to expose a top surface of the uppermost insulating layer 127. The gap-fill insulating layer may be formed of, for example, at least one of a silicon oxide layer, a silicon nitride layer, and a silicon oxynitride layer. The etching of the gap-fill insulating layer may be performed using a planarization technique, for example, a chemical-mechanical polishing technique and/or an etch-back technique. As a result of the etching of the gap-fill insulating layer, the vertical structures VS and the separation patterns 190 may be separated from each other. According to an embodiment, fourth doped regions 261 and first doped regions 265 may be formed on the vertical structures VS and the separation patterns 190, respectively. The formation of the fourth and first doped regions 261 and 265 may include partially etching top surfaces of the vertical structures VS and the separation patterns 190 exposed by the planarization of the gap-fill insulating layer, and then filling spaces formed by the partial etching process with a semiconductor layer. According to an embodiment, the fourth and first doped regions 261 and 265 may have the same conductivity type. For instance, according to an embodiment, the fourth and first doped regions 261 and 265 may have a different conductivity type from a conductivity type of the substrate 10. According to an embodiment, the fourth and first doped regions 261 and 265 may have different conductivity types from each other. For instance, according to an embodiment, the fourth doped regions 261 may have a different conductivity type from a conductivity type of the substrate 10, and the first doped regions 265 may have the same conductivity type as the conductivity type of the substrate 10. According to an exemplary embodiment of the inventive concept, the fourth and first doped regions 261 and 265 may have the same or substantially the same sectional shapes as the vertical structure VS and the separation pattern 190, respectively.

Figure 11:
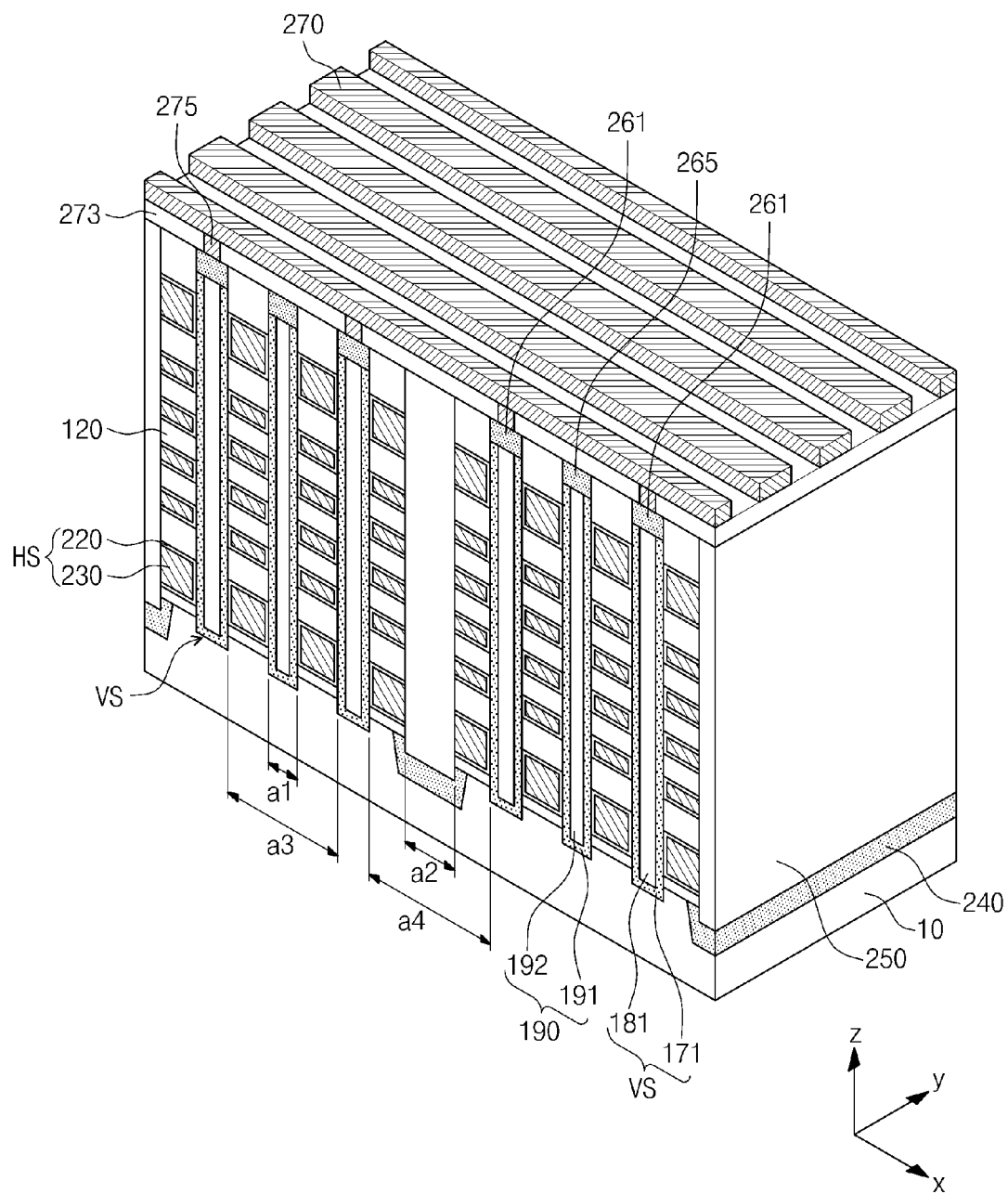

Referring to FIG. 11, upper plugs 275 may be formed on the vertical structures VS, respectively, and upper lines 270 may be formed on the upper plugs 275 to connect the upper plugs 275 with each other. The formation of the upper plugs 275 may include forming an interlayer dielectric layer 273 on the resultant structure having the fourth and first doped regions 261 and 265, for example, the structure shown in FIG. 10, and forming a conductive layer. The interlayer dielectric layer 273 may have openings exposing the fourth and first doped regions 261 and 265, and the conductive layer may be formed to fill the openings of the interlayer dielectric layer 273. According to an embodiment, the upper plugs 275 may be formed of a doped silicon layer or a metallic layer. Each of the upper lines 270 may be electrically connected to the vertical semiconductor layer 171 via the upper plug 275 and may be formed to cross the horizontal structures HS. According to an exemplary embodiment, in the case that the semiconductor device is a NAND FLASH memory, the upper lines 270 may be electrically coupled to a plurality of cell strings and may serve as bit lines.

Referring to FIGS. 10 and 11, as described above, the three-dimensional semiconductor device may include the gap-fill insulating patterns 250 extending from the substrate 10. The three-dimensional semiconductor devices may further include electrode structures that include the conductive patterns 230 and the insulating layers 120 alternately stacked on the substrate 10. The electrode structures may be defined by sidewalls of the gap-fill insulating patterns 250.

The vertical structures VS may be provided to penetrate the electrode structures. The vertical structures VS each may include the vertical semiconductor layer 171 and the vertical gap-fill layer 181 surrounded by the vertical semiconductor layer 171. The vertical structures VS may include first and second rows of vertical structures, each of which may include a plurality of the vertical structures VS arranged along the y-direction, between two adjacent gap-fill insulating patterns of the gap-fill insulating patterns 250. The first and second rows of vertical structures may be spaced apart from each other in the x-direction. The memory layers 220 may be provided between the vertical structures VS and the conductive patterns 230.

A separation pattern 190 may be provided between the first and second rows of vertical structures. The separation pattern 190 may include the separation semiconductor layer 191 and the separation insulating layer 192 surrounded by the separation semiconductor layer 191, and may extend in the y-direction along the first and second rows of vertical structures. The vertical semiconductor layer 171 and the separation semiconductor layer 191 may be formed using the same process as described above. As a result, the vertical semiconductor layer 171 and the separation semiconductor layer 191 may be formed of the same semiconductor material having the same or substantially the same impurity concentration and/or the same or substantially the same physical properties. As viewed from above, for example, as viewed in a direction opposite to the z direction, the separation pattern 190 may be shaped as circles partially overlapping each other along the y-direction, but the exemplary embodiments are not limited thereto.

The gap-fill insulating pattern 250 may be formed to have a width a2, which may be selected in consideration of the formation of the conductive patterns 230. As described with reference to FIGS. 7 through 9, the width a2 of the second trench 200 or the gap-fill insulating pattern 250 filling the second trench 200 may be adapted to be sufficient to facilitate the removal of the sacrificial layers 130 and the formation of the conductive patterns 230. According to an exemplary embodiment of the inventive concept, the gap-fill insulating patterns 250 may be formed at a first side of a y-directional row of the vertical structures, but not at a second side opposite to the first side. At the second side of the y-directional row of the vertical structures, the separation pattern 190 having the width a1 may be provided, where the width a1 may be less than the width a2 of the gap-fill insulating pattern 250. For example, the gap-fill insulating patterns 250 and the separation patterns 190 may be alternately arranged in the x-direction, with a row of vertical structures VS between a gap-fill insulating pattern 250 and a separation pattern 190. As a result, the three-dimensional semiconductor device can have a reduced x-directional width, thus resulting in an increase in integration density. The conductive patterns 230 may be electrically separated from the separation patterns 190 by the memory layer 220.

According to an embodiment, some of distances in the x direction between the vertical structures VS may be different from each other. For instance, according to an embodiment, a distance a3 between a pair of the vertical structures VS provided at two opposite sides of the separation pattern 190 may be smaller than a distance a4 between a pair of the vertical structures VS provided at two opposite sides of the gap-fill insulating pattern 250. For example, x-directional distances between the vertical structures VS may include the distances a3 and a4 that alternately occur since the width a1 of the separation pattern 190 is smaller than the width a2 of the gap-fill insulating pattern 250. As a result, the three-dimensional semiconductor device can be fabricated to have a reduced x-directional width, and consequently, to have an increased integration density. Furthermore, since the separation patterns 190 may structurally support the mold structure 100, the removal of the sacrificial layers 130 and the formation of the conductive patterns 230 may be stably performed, compared with the absence of the separation pattern 190.

FIGS. 12 through 20 are perspective views illustrating a method of fabricating a three-dimensional semiconductor device according to an embodiment of the inventive concept. For simplicity, overlapping description of the same components as in the embodiments described with reference to FIGS. 2 through 11 may be omitted.

Figure 12:
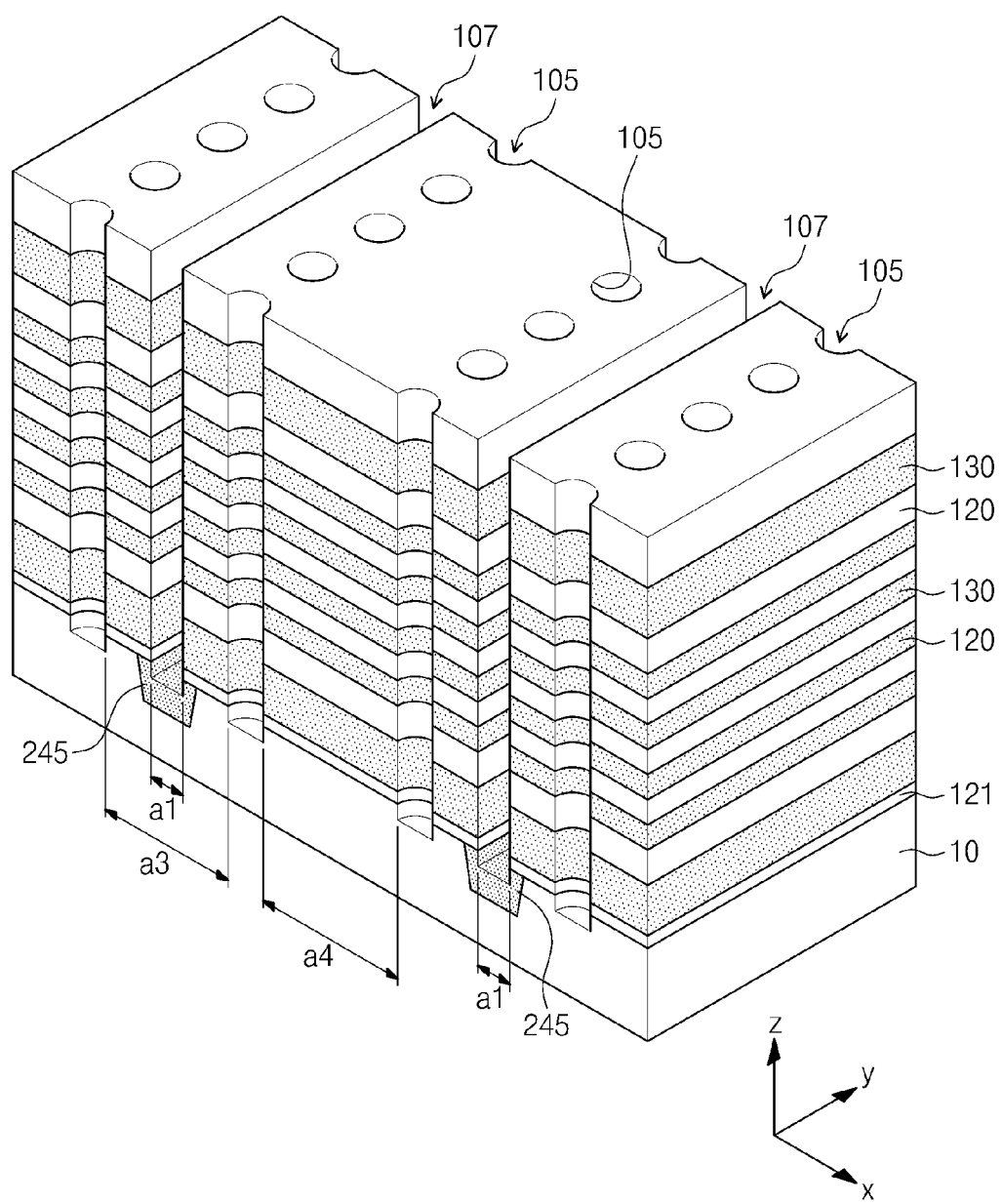

Referring to FIG. 12, channel holes 105 and first trenches 107 may be formed in the mold structure 100 described with reference to FIG. 2. The channel holes 105 may penetrate the mold structure 100. The first trenches 107 may extend along the y-direction. The first trenches 107 may be formed at a first side of a row of the channel holes 105 arranged along the y-direction, and may not be formed at a second side of the row of channel holes 105, which is opposite to the first side with respect to the row of channel holes 105. For example, according to an embodiment, in the case that the channel holes 105 may be arranged in a plurality of rows including first, second, and third rows, the first trench 107 may be formed between the first and second rows, but not between the second and third rows. As viewed from above the first trenches 107, each of the first trenches 107 may have an elongated stripe shape along the y-direction. An x-directional width a1 of the first trench 107 may be greater than or equal to a diameter of the channel hole 105.

X-directional distances between the channel holes 105 may be different from each other. For example, according to an embodiment, a distance a3 between a first pair of the channel holes 105 formed at two opposite sides of the first trench 107 may be less than a distance a4 between a second pair of the channel holes 105 without any intervening first trench 107 between the second pair of the channel holes 105. According to an embodiment, the channel holes 105 and the first trenches 107 may be formed using the same process. For example, according to an embodiment, the channel holes 105 and the first trenches 107 may be formed simultaneously.

Second doped regions 245 may be formed in portions of the substrate 10 exposed by the first trenches 107. The formation of the second doped regions 245 may include forming a mask layer that fills the channel holes 105 and exposes the first trenches 107 and then performing an ion implantation process. Alternatively, in the case that the second doped regions 245 may have substantially the same conductivity type as the substrate 10, the second doped regions 245 may be also formed in portions of the substrate 10 exposed by the channel holes 105. Features of the second doped region 245, such as conductivity type and function, will be described in further detail below, in conjunction with a first doped region.

Figure 13:
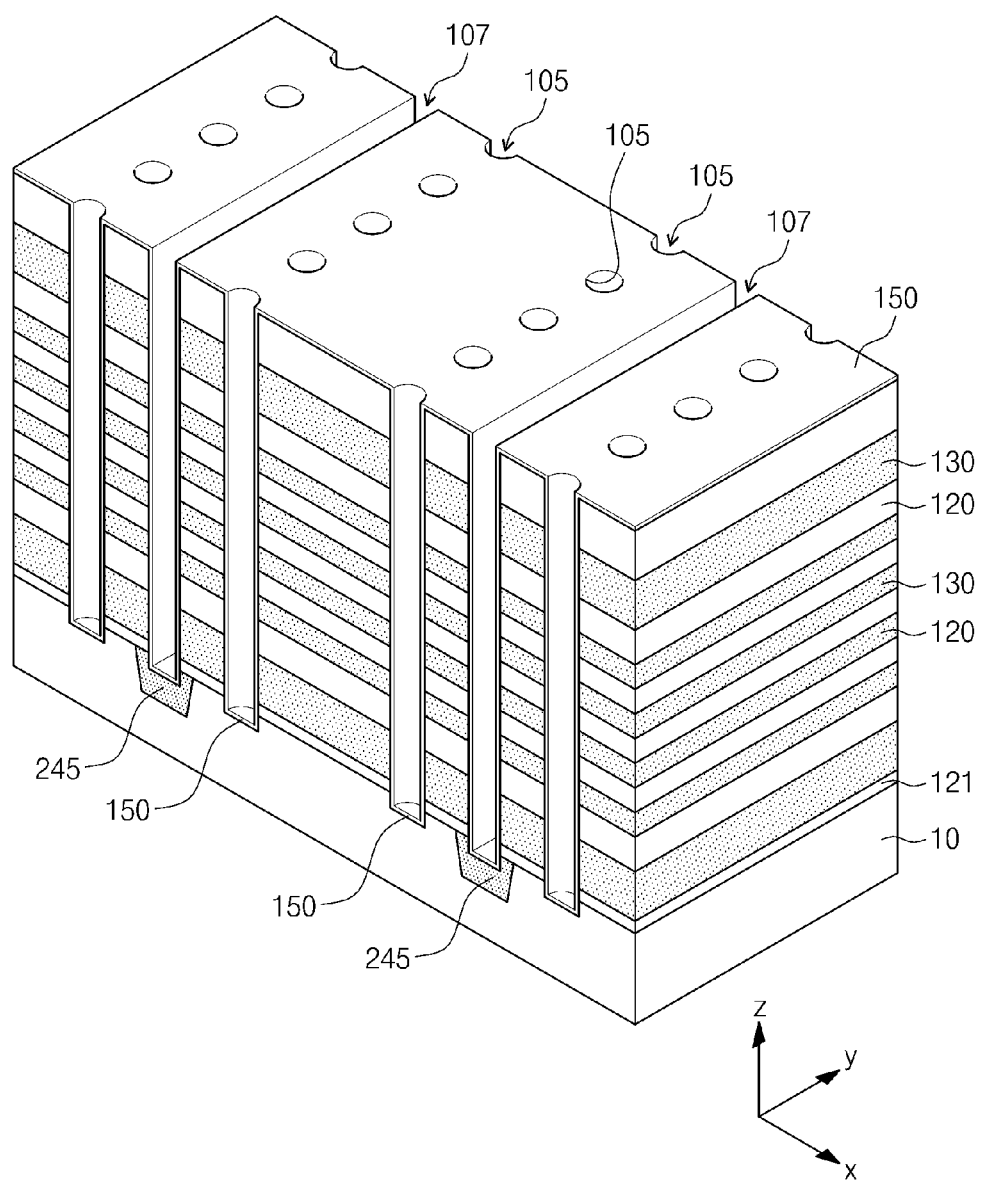

Referring to FIG. 13, a vertical layer 150 may be formed on the resultant structure provided with the first trenches 107, for example, the structure shown in FIG. 9. The vertical layer 150 may be formed on sidewalls and bottom surfaces of the channel holes 105 and the first trenches 107. According to an embodiment, the vertical layer 150 may include one or more layers. For example, according to an embodiment, the vertical layer 150 may include at least one layer used as a memory element of a charge-trap-type nonvolatile memory transistor. Exemplary embodiments of the inventive concept may be diversely classified according to the type of the vertical layer 150. These classified embodiments will be described in further detail with reference to FIGS. 21 through 28.

Figure 14:
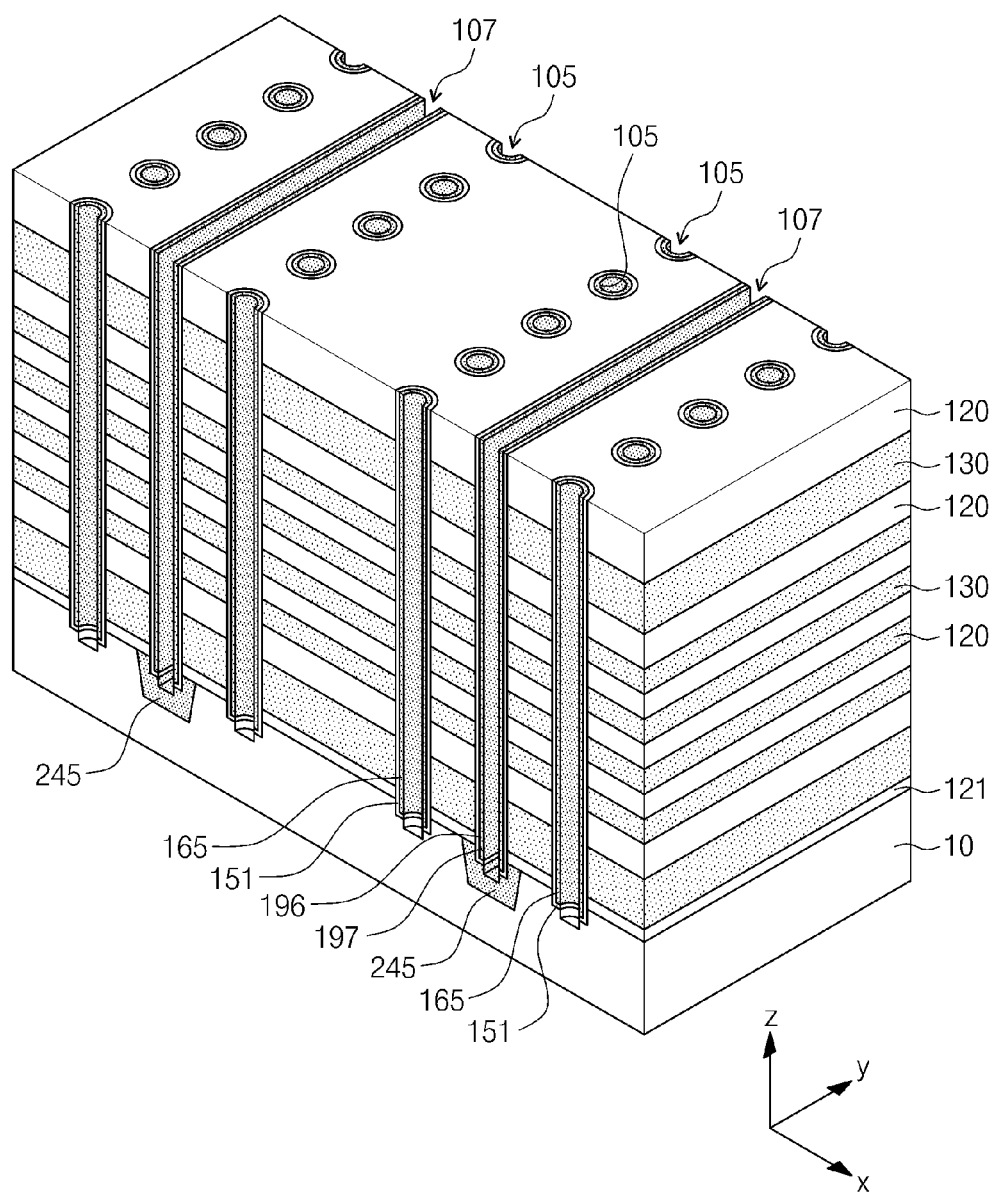

Referring to FIG. 14, a vertical pattern 151 and a spacer 165 may be formed on each of inner walls of the channel holes 105, and a vertical separation pattern 196 and a spacer separation pattern 197 may be formed on each of inner walls of the first trenches 107. The process of forming the vertical pattern 151, the spacer 165, the vertical separation pattern 196, and the spacer separation pattern 197 may include forming a first semiconductor layer (not shown) to conformally cover the structure shown in FIG. 13 and anisotropically etching the first semiconductor layer and the vertical layer 150 to expose the top surface of the substrate 10 at the bottoms of the channel holes 105 and the first trenches 107. As a result, the vertical pattern 151 and the spacer 165 may be formed in each of the channel holes 105, and the vertical separation pattern 196 and the spacer separation pattern 197 may be formed in each of the first trenches 107. The top surface of the substrate 10 exposed in the channel holes 105 and the first trenches 107 may be recessed by over-etching during the anisotropic etching of the first semiconductor layer and the vertical layer 150.

A top surface of the mold structure 100 may be exposed by the anisotropic etching of the first semiconductor layer and the vertical layer 150. Thus, each of the vertical patterns 151 and each of the spacers 165 may be localized in the channel hole 105, and each of the vertical separation patterns 196 and each of the spacer separation patterns 197 may be localized in the first trench 107.

Figure 15:
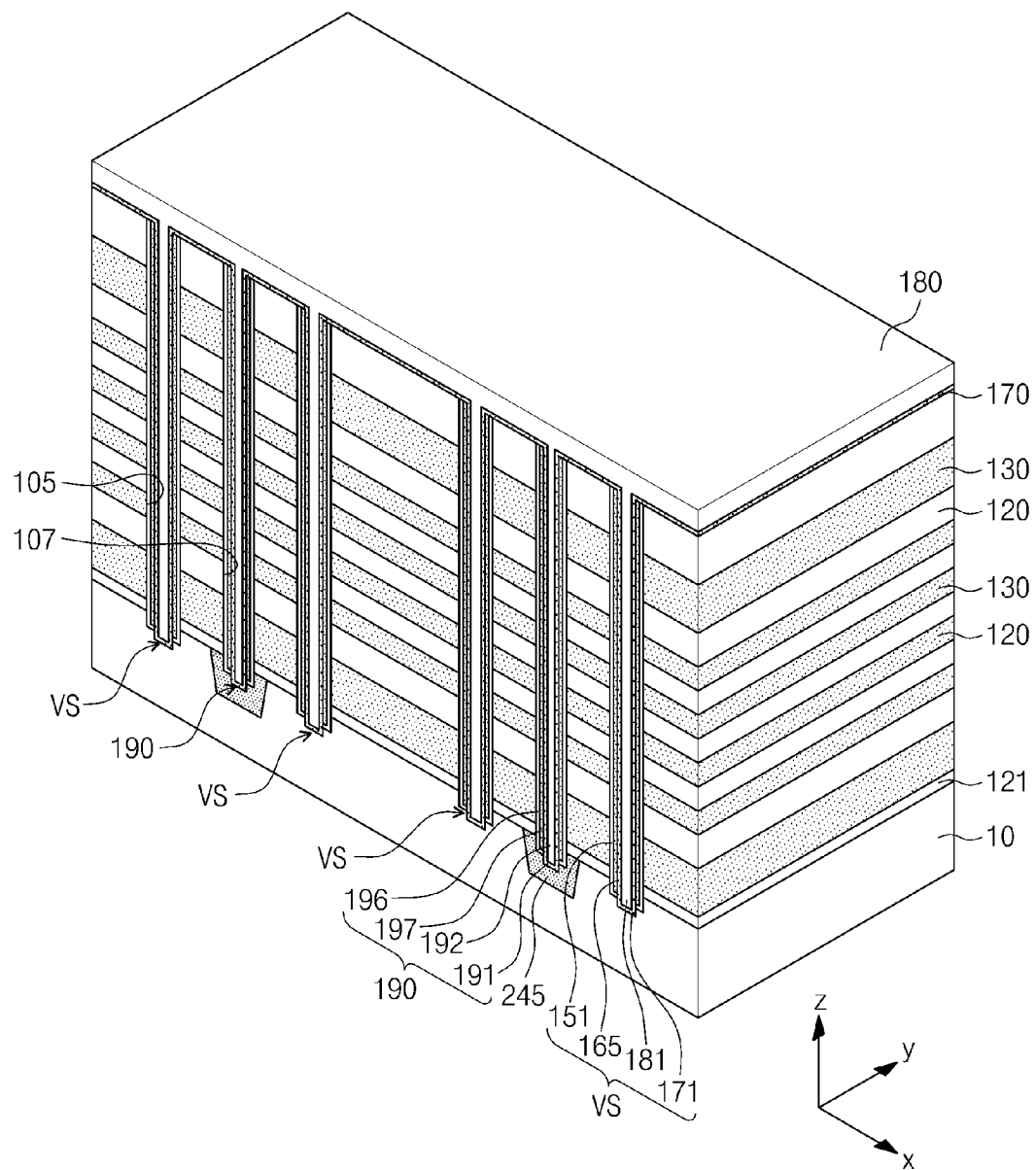

Referring to FIG. 15, a semiconductor layer 170 and a gap-fill layer 180 may be sequentially formed on the resultant structure described with reference to FIG. 14. The semiconductor layer 170 may include a separation semiconductor layer 191 formed in the first trench 107 and a vertical semiconductor layer 171 formed in the channel hole 105. The semiconductor layer 170 may be a polysilicon layer, which may be formed using ALD or CVD. According to an embodiment, the semiconductor layer 170 may be conformally formed to have such a thickness as not to completely fill the channel holes 105 and the first trenches 107. The gap-fill layer 180 may be formed to completely fill the remaining spaces of the channel holes 105 and the first trenches 107. The gap-fill layer 180 may include a separation insulating layer 192 filling the first trench 107 and a vertical gap-fill layer 181 filling the channel hole 105. The vertical pattern 151, the spacer 165, the vertical semiconductor layer 171, and the vertical gap-fill layer 181 may constitute a vertical structure VS. The vertical separation pattern 196, the spacer separation pattern 197, the separation semiconductor layer 191, and the separation insulating layer 192 may constitute a separation pattern 190 in the first trench 107.

Figure 16:
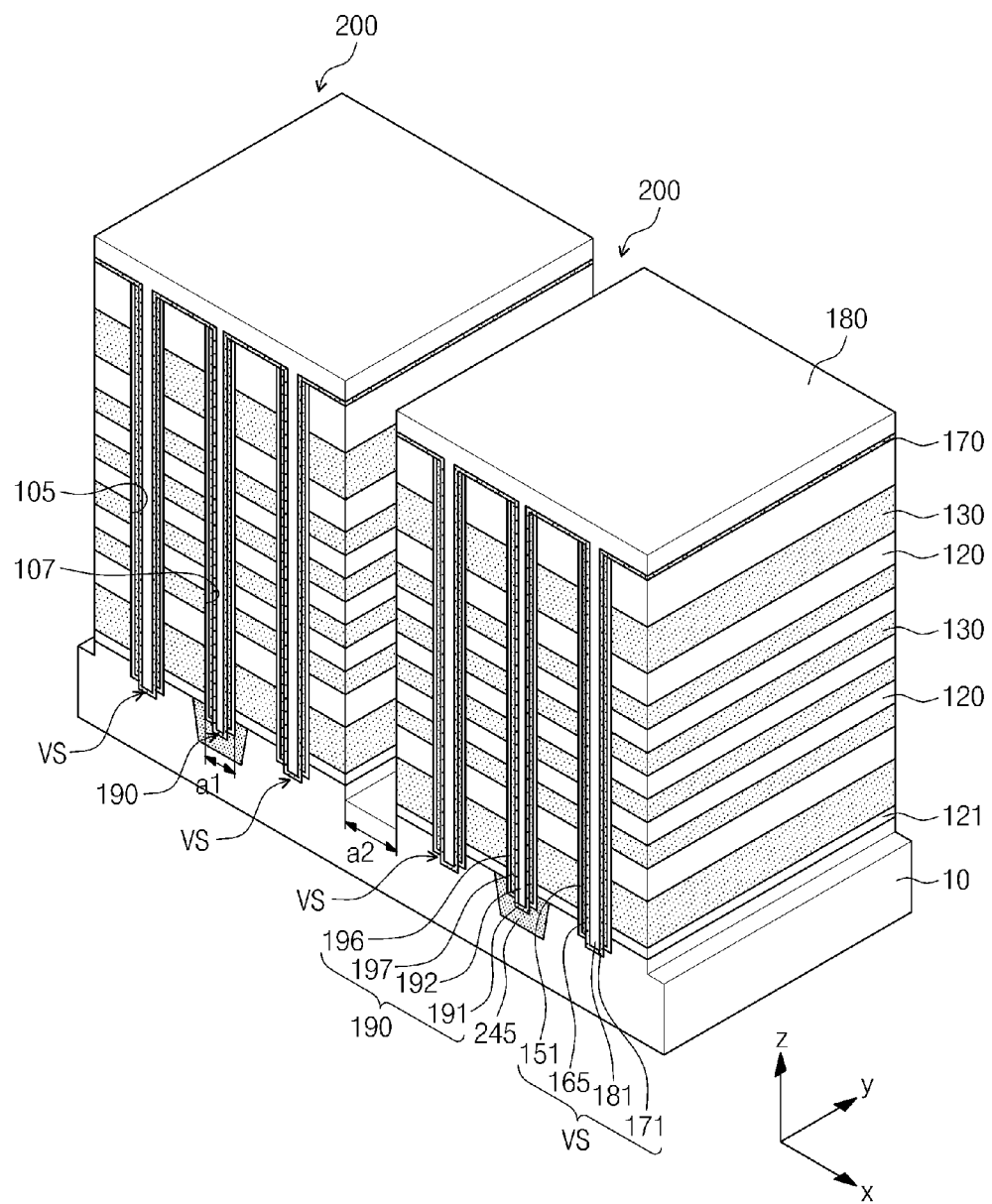

Referring to FIG. 16, second trenches 200 that expose the substrate 10 may be formed by patterning the mold structure 100. The second trench 200 may be formed at a side of a row of channel holes 105 arranged along the y-direction. For example, a row of channel holes 105 may be interposed between a first trench 107 and a second trench 200. For instance, in the case that the channel holes 105 may be arranged in a plurality of rows including first, second, and third rows, the second trench 200 may be formed between the second and third rows, but may not be formed between the first and second rows. As a result, in the x-direction, the first trenches 107 and the second trenches 200 may be alternately formed with a rows of the channel holes 105 between neighboring first trench 107 and second trench 200.

An x-directional width a2 of the second trench 200 may be greater than the x-directional width a1 of the first trench 107. According to an embodiment of the inventive concept, each of the rows of the channel holes 105 may be disposed between the first and the second trenches 107 and 200 that are adjacent to each other. Here, since the first trenches 107 may have a smaller width (for example, a1) than a width of the second trench 200 (for example, a2) as described above, the mold structure 100 may be formed to have a reduced x-directional width.

Figure 17:
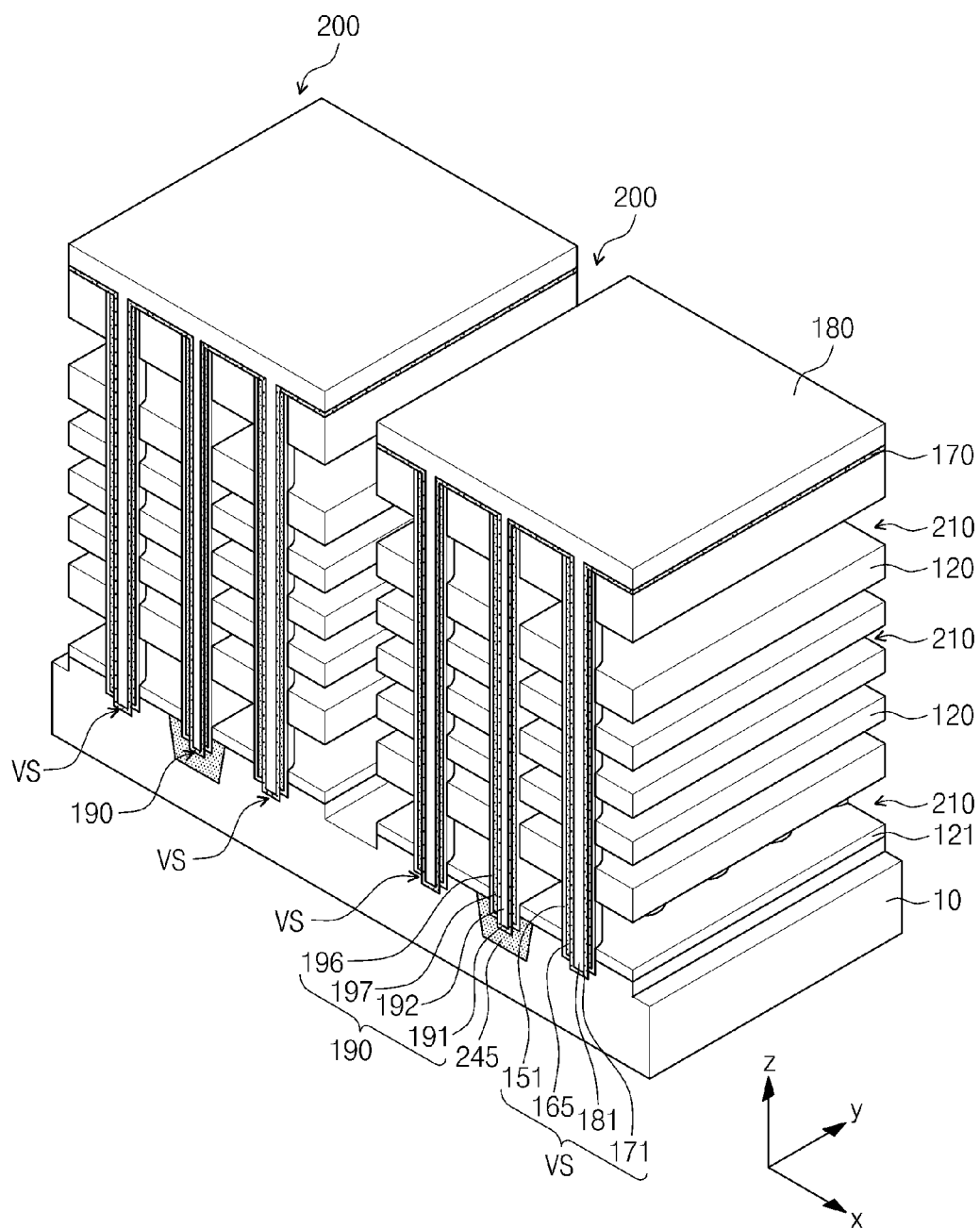

Referring to FIG. 17, recess regions 210 may be formed by selectively removing the sacrificial layers 130 exposed by the second trenches 200. The recess regions 210 may be a gap region laterally extending from the second trenches 200, and expose sidewalls of the vertical pattern 151 and the vertical separation pattern 196. Portions of the sacrificial layers 130, which are interposed between the vertical structure VS and the separation pattern 190 that are adjacent to each other can be etched out through portions of the recess region 210, which are positioned between the vertical structures VS arranged along the y-direction. For example, a wet etchant can be delivered from the second trench 200 to a sidewall of the separation pattern 190 through spaces between the y-directionally separated vertical structures VS. As a result, the portions of the sacrificial layer 130 interposed between the vertical structure VS and the separation pattern 190 can be fully removed during the formation of the recess regions 210.

The separation patterns 190 may be connected to the top surface of the substrate 10 and may extend along the y-direction, and thus, after the removal of the sacrificial layers 130, the separation patterns 190 and the vertical structures VS may structurally support the mold structure 100. For instance, an external force (e.g., a gravitational force) exerted on the mold structure 100 may be dispersed by the vertical structures VS and the separation patterns 190. As a result, the removal of the sacrificial layers 130 and a subsequent process of forming electrodes may be stably performed.

Figure 18:
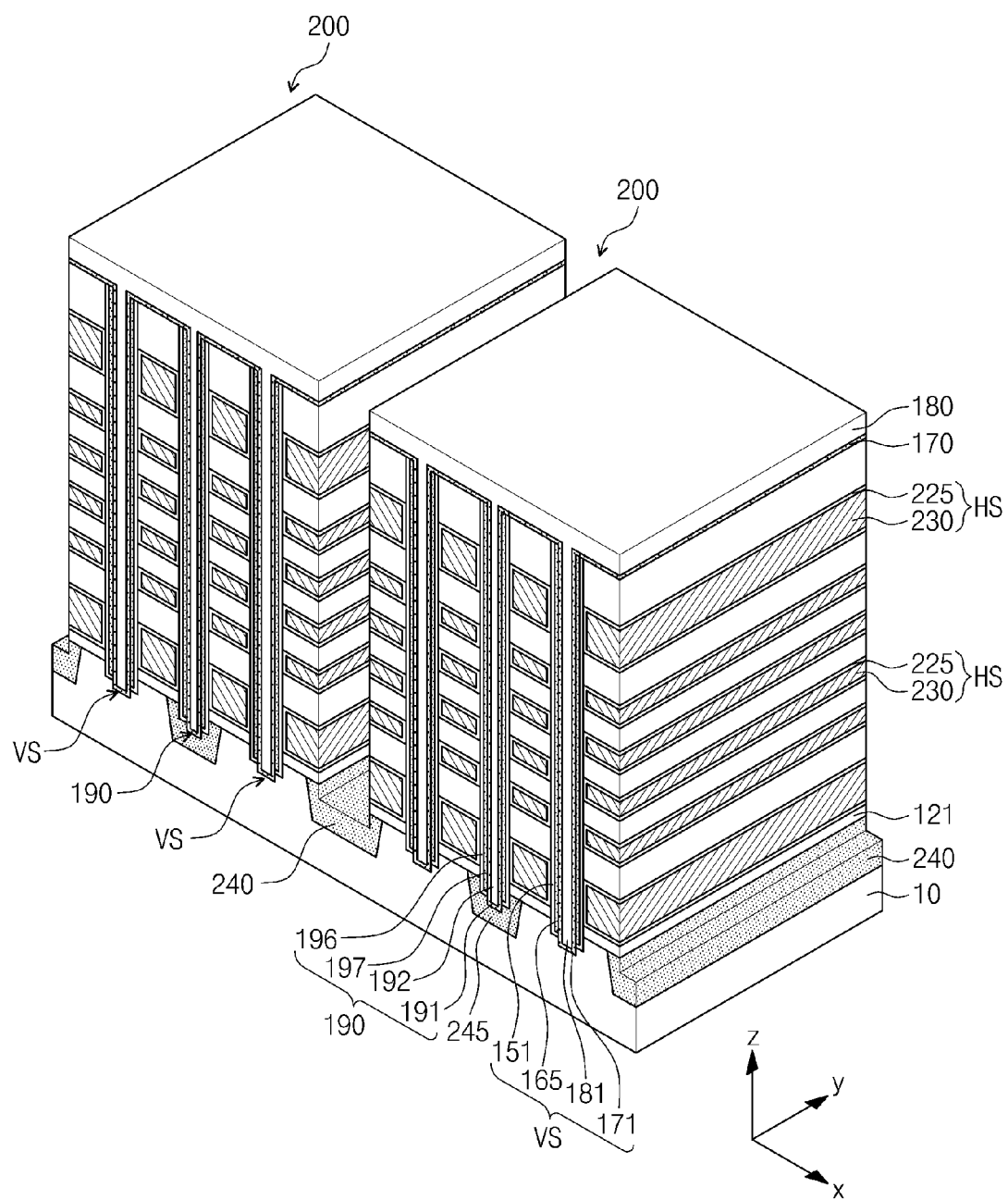

Referring to FIG. 18, horizontal structures HS may be formed to fill the recess regions 210. The horizontal structure HS may include a horizontal pattern 225 covering an inner wall of the recess region 210 and a conductive pattern 230 filling the remaining space of the recess region 210. The formation of the horizontal structures HS may include sequentially forming a horizontal layer and a conductive layer to fill the recess regions 210 and removing the conductive layer from the second trenches 200 to leave the conductive patterns 230 in the recess regions 210. The horizontal pattern 225 and the vertical pattern 151 may constitute memory layers. According to an embodiment, the horizontal layer or the horizontal pattern 225 may include one or more layers, similar to the vertical layer 150. According to an embodiment, the horizontal pattern 225 may include a blocking insulating layer of a charge trap type nonvolatile memory transistor. As mentioned above, the exemplary embodiments of the inventive concept may be diversely classified according to the layers included in the vertical pattern 151 and the horizontal pattern 225, some of which will be described in further detail with reference to FIGS. 21 through 28.

According to an exemplary embodiment of the inventive concept, in the case that the semiconductor device is a FLASH memory, third doped regions 240 may be formed in the substrate 10 after the forming of the conductive patterns 230. The third doped regions 240 may be formed by an ion implantation process in the substrate 10 exposed by the second trenches 200. According to an embodiment, the third doped regions 240 may have a different conductivity type than the substrate 10.

Figure 19:
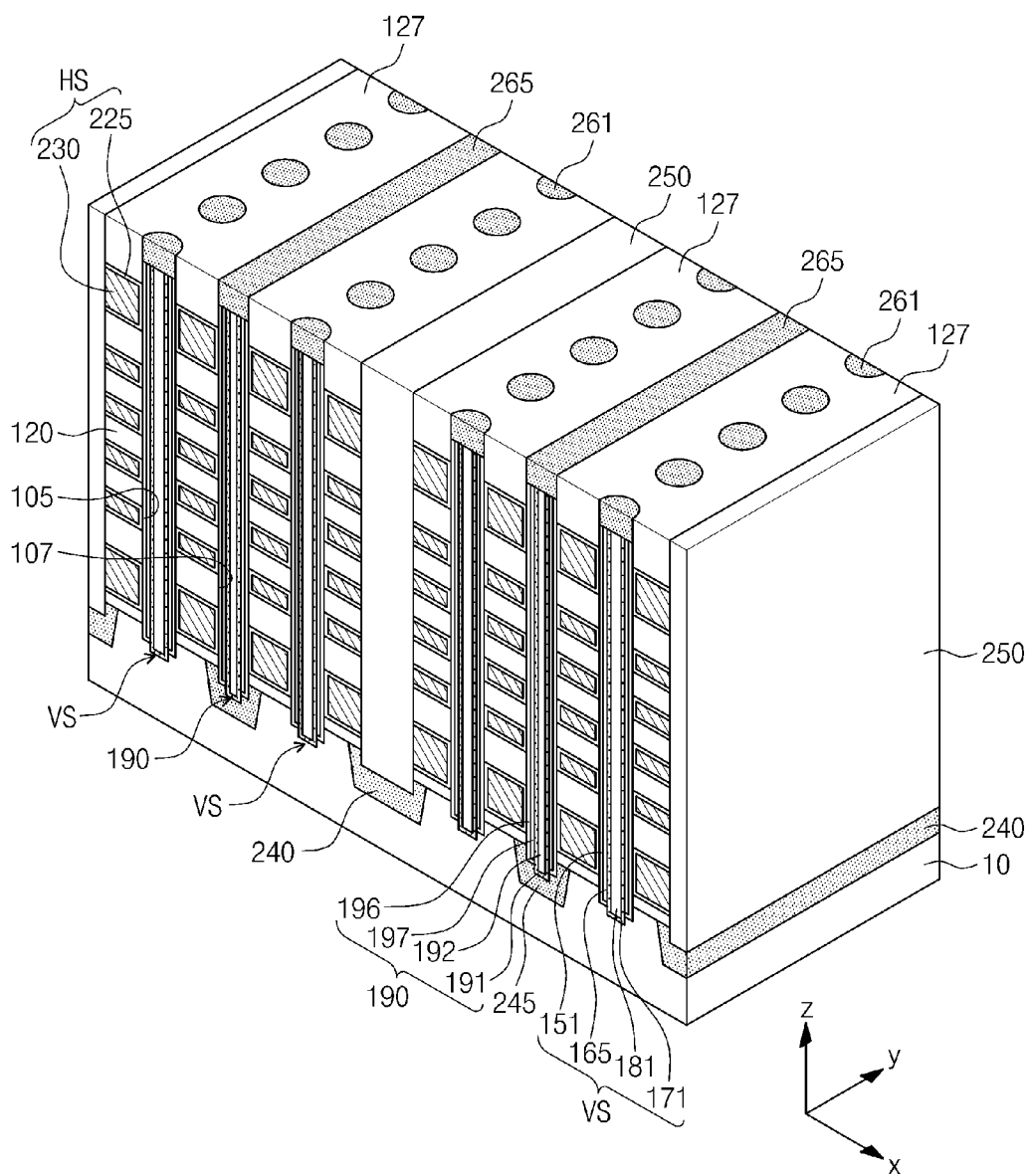

Referring to FIG. 19, gap-fill insulating patterns 250 may be formed to fill the second trenches 200. The formation of the gap-fill insulating pattern 250 may include forming a gap-fill insulating layer (not shown) on the resultant structure provided with the third doped regions 240, for example, the structure shown in FIG. 18, and etching the gap-fill insulating layer to expose a top surface of the uppermost insulating layer 127. The etching of the gap-fill insulating layer may be performed using a planarization technique. Fourth doped regions 261 and first doped regions 265 may be formed on the vertical structures VS and the separation patterns 190, respectively. The formation of the fourth and first doped regions 261 and 265 may include partially etching top surfaces of the vertical structures VS and the separation patterns 190 exposed by the planarization of the gap-fill insulating layer and filling spaces formed by the partial etching process with a semiconductor layer.

Figure 20:
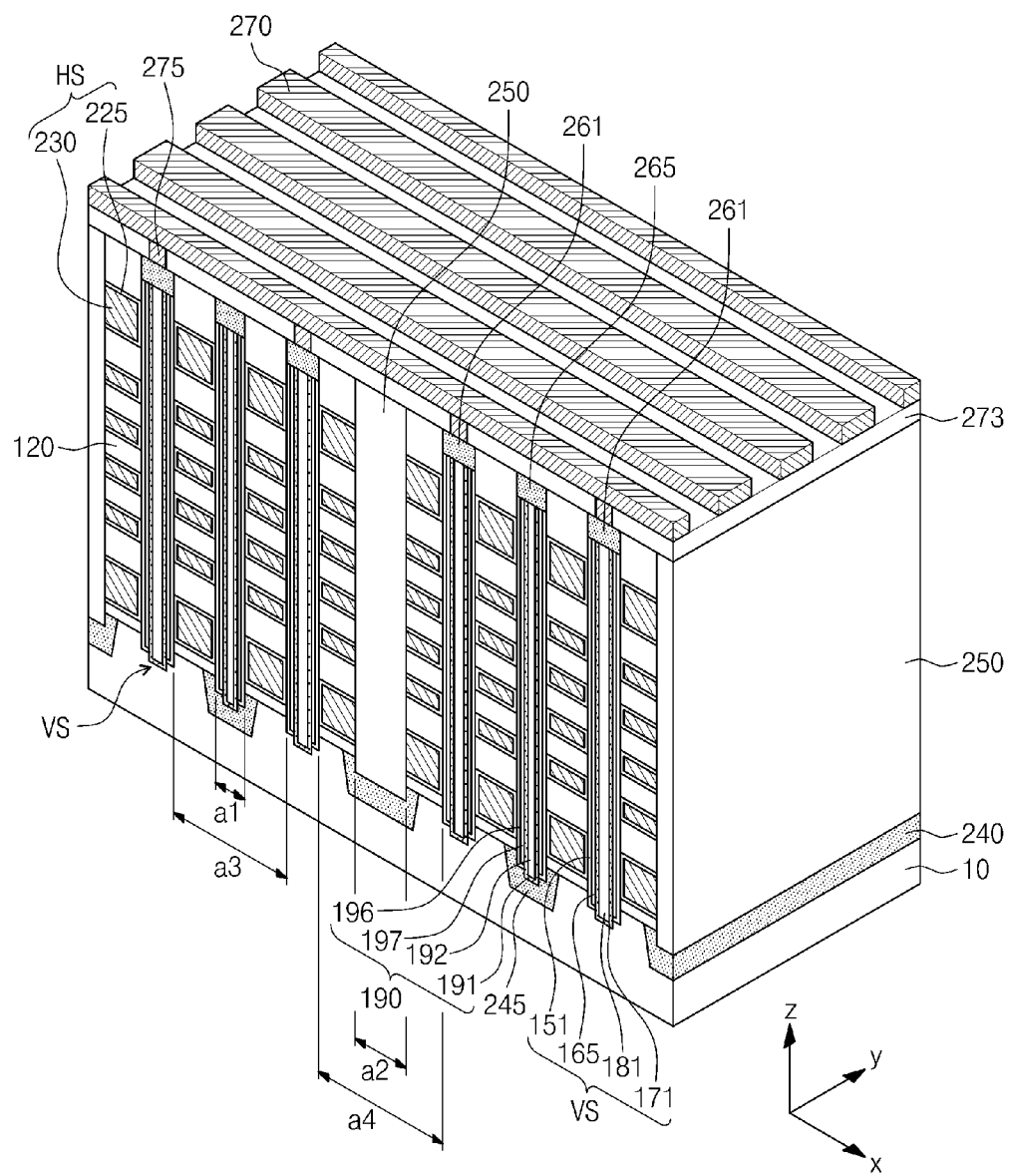

Referring to FIG. 20, upper plugs 275 penetrating an interlayer dielectric 273 may be formed on the vertical structures VS, respectively, and upper lines 270 may be formed on the upper plugs 275 to connect the upper plugs 275 with each other.

Referring to FIGS. 19 and 20, as described above, the three-dimensional semiconductor device may include the gap-fill insulating patterns 250 extending from the substrate 10. The three-dimensional semiconductor device may further include electrode structures including the conductive patterns 230 and the insulating layers 120 alternately stacked on the substrate 10, and the electrode structures may be defined by sidewalls of the gap-fill insulating patterns 250.

The vertical structures VS may be provided to penetrate the electrode structures. The vertical structure VS may include the vertical pattern 151, the spacer 165, the vertical semiconductor layer 171, and the vertical gap-fill layer 181, which are sequentially stacked in the channel hole 105. The vertical structures VS may include first and second rows of vertical structures, each of which may include a plurality of the vertical structures VS arranged along the y-direction, between adjacent two gap-fill insulating patterns 250. The first and second rows of vertical structures may be spaced apart from each other in the x-direction.

A separation pattern 190 may be provided between the first and second rows of vertical structures VS. The separation pattern 190 may include a vertical separation pattern 196, a spacer separation pattern 197, a separation semiconductor layer 191, and a separation insulating layer 192, which are sequentially stacked in the first trench 107, and may extend along the y-direction as the first and second rows of vertical structures. As viewed from above the separation pattern 190, the separation pattern 190 may have a stripe shape elongated along the y-direction.

The gap-fill insulating pattern 250 may be formed to have a width a2, which may be selected in consideration of the formation of the conductive patterns 230. According to an exemplary embodiment of the inventive concept, the gap-fill insulating patterns 250 may be formed at a first side of a y-directional row of the vertical structures, but not at a second side of the y-directional row of the vertical structure, wherein the second side is opposite to the first side. At the second side of the y-directional row of the vertical structures, the separation pattern 190 having the width a1 may be provided, wherein the width a1 may be less than the width a2 of the gap-fill insulating pattern 250. For example, in the x-direction, the gap-fill insulating patterns 250 and the separation patterns 190 may be alternately arranged between the vertical structures VS so that a row of vertical structures VS is arranged between a gap-fill insulating pattern 250 and a separation pattern 190 that are adjacent to each other. As a result, the three-dimensional semiconductor device can be fabricated to have a reduced x-directional width, and consequently, to have an increased integration density. The conductive patterns 230 may be electrically separated from the separation patterns 190 by the memory layers 225.

According to an embodiment, some of distances in the x direction between the vertical structures VS may be different from each other. For instance, according to an embodiment, a distance a3 between a pair of the vertical structures VS provided at two opposite sides of the separation pattern 190 may be smaller than a distance a4 between a pair of the vertical structures VS provided at two opposite sides of the gap-fill insulating pattern 250. For example, as shown in FIG. 20, x-directional distances between the vertical structures VS may include the distances a3 and a4 that alternately occur since the width a1 of the separation pattern 190 is smaller than the width a2 of the gap-fill insulating pattern 250. As a result, the three-dimensional semiconductor device can be fabricated to have a reduced x-directional width, and consequently, to have an increased integration density.

According to an embodiment, the fourth doped regions 261 provided on the vertical structures VS may have the same conductivity type as the third doped regions 240 formed in the substrate 10 under the gap-fill insulating patterns 250. For instance, according to an embodiment, the third and fourth doped regions 240 and 261 may have a different conductivity type from the substrate 10. According to an embodiment, the first doped regions 265 provided on the separation patterns 190 may have the same conductivity type as the second doped regions 245 provided under the separation patterns 190. For instance, according to an embodiment, the first and second doped regions 265 and 245 may have the same conductivity type as the substrate 10 and may have greater impurity concentrations than the substrate 10. In the case that the first and second doped regions 265 and 245 may have the same conductivity type as the substrate 10 as described above, the first and second doped regions 265 and 245 and the separation patterns 190 can be ohmically connected to the substrate 10, and therefore, can be used as portions of conductive lines that deliver a bulk voltage to the substrate. For example, according to an exemplary embodiment, in the case that the semiconductor device is a NAND FLASH memory, an erase voltage can be delivered to the substrate 10 during an erase step via the first and second doped regions 265 and 245 and the separation patterns 190.

According to an embodiment, the first and second doped regions 265 and 245 may be of a different conductivity type from the substrate 10. For instance, according to an embodiment, the first and second doped regions 265 and 245 may exhibit the same conductivity type as the third and fourth doped regions 240 and 261. According to an embodiment, the separation semiconductor layer 191 may be formed of an intrinsic semiconductor so that the first and second doped regions 265 and 245 may be electrically used as a portion of a common source line. The conductivity types and functions of the doped regions described herein may also be applied to the three-dimensional semiconductor device described with reference to FIGS. 2 through 11.

According to the embodiments described with reference to FIGS. 12 through 20, the separation patterns 190 may be a part of the conductive line configured to deliver a predetermined voltage to the substrate 10 or a part of the common source line.

The vertical pattern 151 and the horizontal pattern 225 according to an exemplary embodiment of the inventive concept will be described in further detail with reference to FIGS. 21 through 28. FIG. 26B is and enlarged view of a region F of FIG. 26A. The horizontal pattern 225 and the vertical pattern 151 may be part of a memory element of a memory cell transistor. The memory element may include a plurality of layers, and the number and types of layers constituting each of the horizontal and vertical patterns 225 and 151 may vary, so that various exemplary embodiments of the inventive concept may be provided based on the number and types of layers. For example, exemplary embodiments of the inventive concept may include various types of memory layer (which is also referred to as an "information storage layers") as in the following Table 1.

TABLE 1

| Information storage layer | | | | | | | Corresponding |
|---|---|---|---|---|---|---|---|
| VS | | | | HS | | | FIG. |
| SP | TIL | CL | CPL | BIL1 | | 230 | 21[1] |
| SP | TIL | CL | | BIL1 | | 230 | 22 |
| SP | TIL | | CL | BIL1 | | 230 | 23 |
| SP | TIL | CL | | BIL1 | BIL2 | 230 | 24 |
| SP | TIL | | CL | BIL1 | BIL2 | 230 | 25 |
| SP | TIL | CL | CPL | BIL1 | | 230 | 26[2] |
| SP | TIL | CL | CPL | BIL1 | | 230 | 27[3] |
| SP | TIL | CL | CPL | BIL1 | BIL2 | 230 | 28 |

TIL: Tunnel Insulating layer
CL: Charge storing Layer
SP: Semiconductor Pattern
BIL: Blocking Insulating Layer
CPL: Capping Layer
[1]CPL with uniform thickness
[2]CPL with recessed sidewall
[3]CPL separated vertically According to an exemplary embodiment, in the case that the semiconductor device is a FLASH memory, the memory layer may include a tunnel insulating layer TIL, a charge storing layer CL, and a first blocking insulating layer BIL1 (e.g., as shown in Table 1 and illustrated in FIGS. 21-28). According to a modified embodiment, the memory layer may include a second blocking insulating layer BIL2 between the first blocking insulating layer BIL1 and the conductive pattern 230. According to an embodiment, the memory layer may include a capping layer CPL interposed between the charge storing layer CL and the first blocking insulating layer BIL1. According to an embodiment, the memory layer may be formed using a deposition technique that provides, for example, excellent and/or improved stepped application (e.g., a CVD and/or ALD technique).

Figure 23:
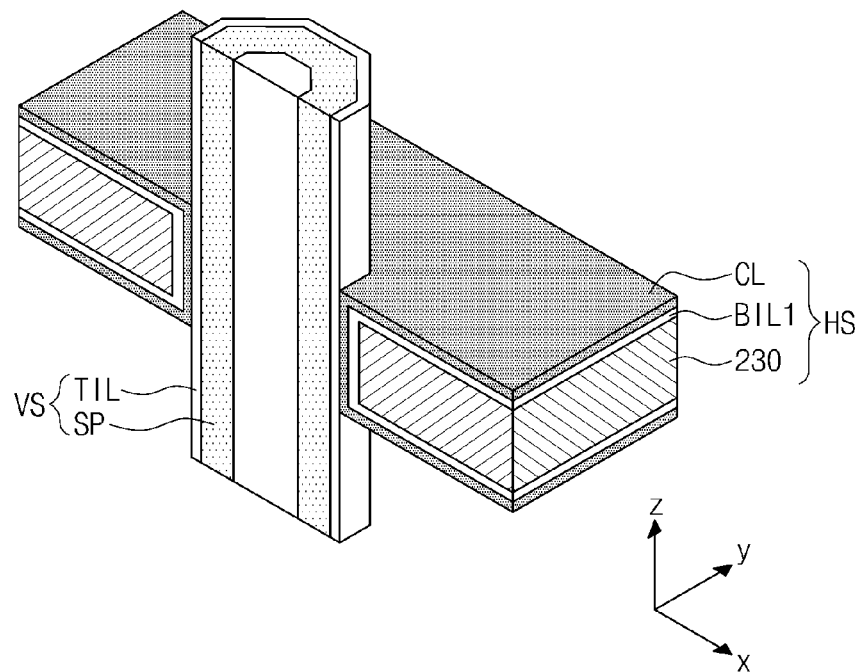
Figure 24:
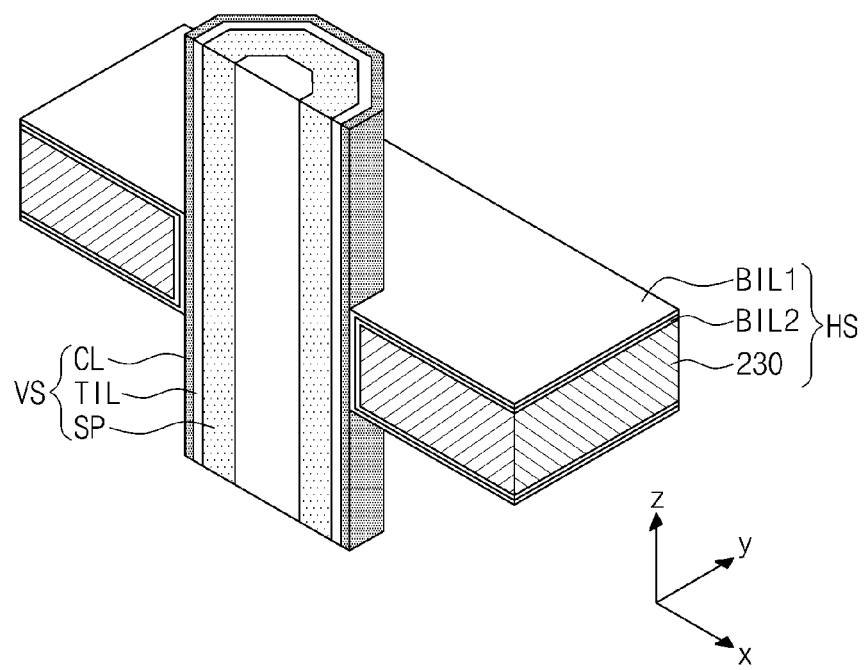
Figure 25:
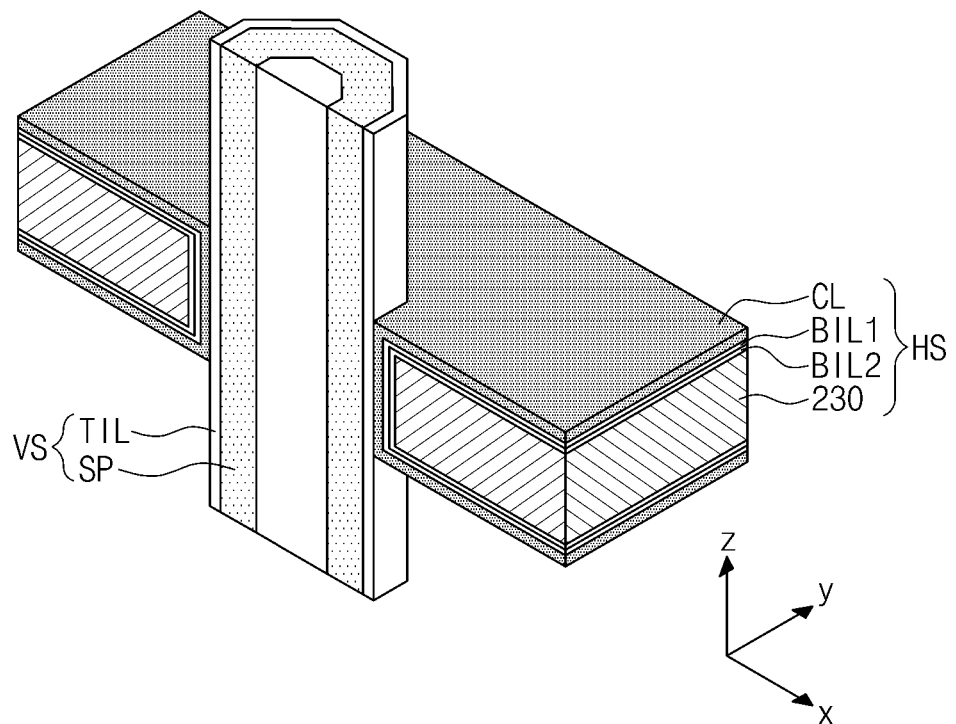
Figure 26A:
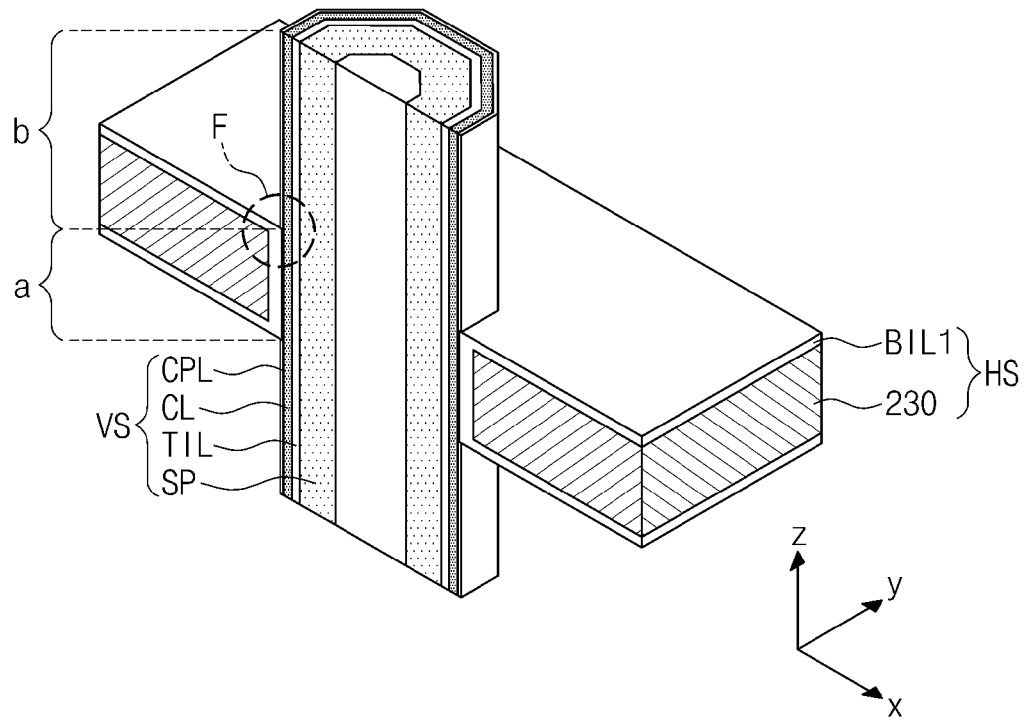
Figure 26B:
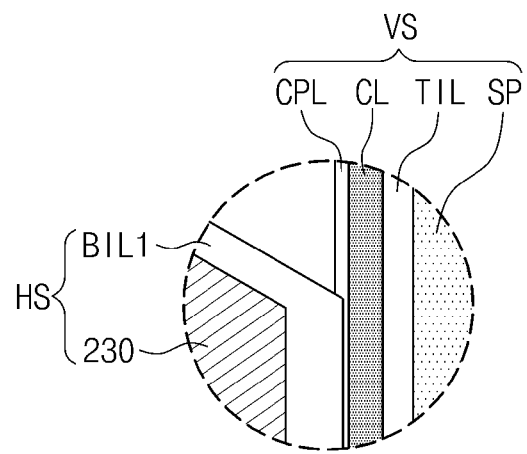

As shown in Table 1 and illustrated in FIGS. 21 to 28, the vertical structure VS may include at least the tunnel insulating layer TIL, and the horizontal structure HS may include at least one of the first and second blocking insulating layers BIL1 and BIL2. According to an exemplary embodiment (e.g., as illustrated in FIGS. 21, 22, 24 and 26-28), the vertical structure VS may include the charge storing layer CL. According to an exemplary embodiment (e.g., as illustrated in FIGS. 23 and 25), the horizontal structure HS may include the charge storing layer CL.

According to an embodiment, if the vertical structure VS includes the charge storing layer CL, the vertical structure VS may further include the capping layer CPL, as illustrated in FIGS. 21 and 26-28. According to an embodiment, the vertical structure VS and the horizontal structure HS may directly contact each other without the capping layer CPL as illustrated in FIGS. 22-25.

Figure 21:
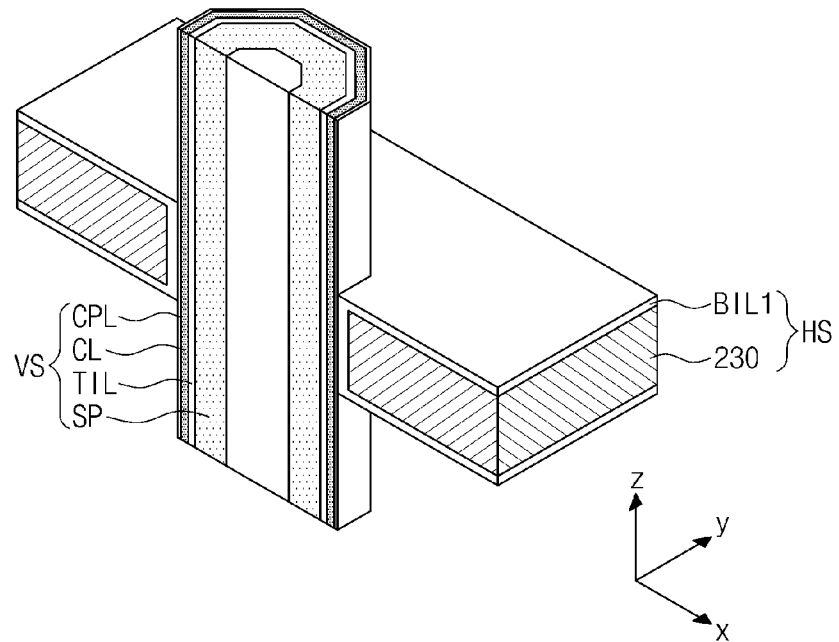
Figure 22:
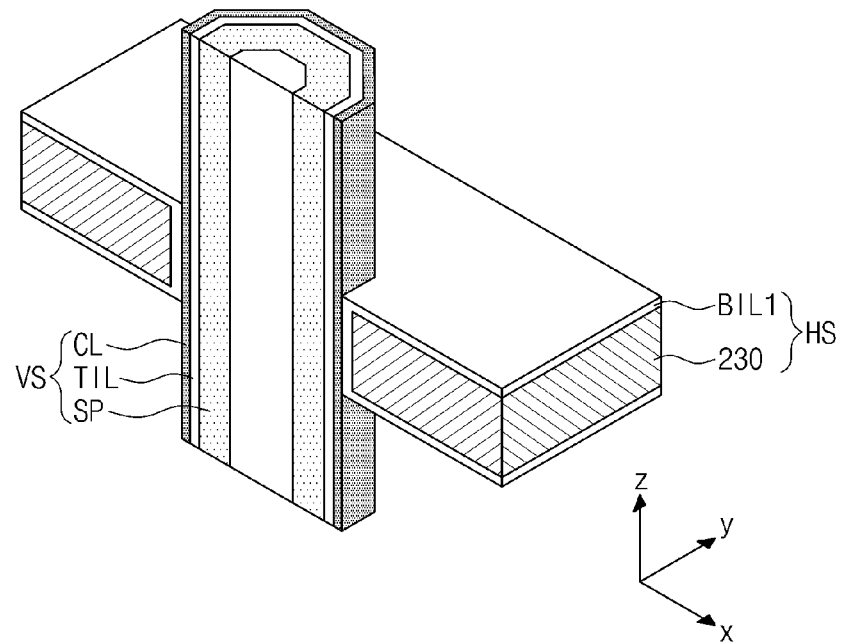
Figure 27:
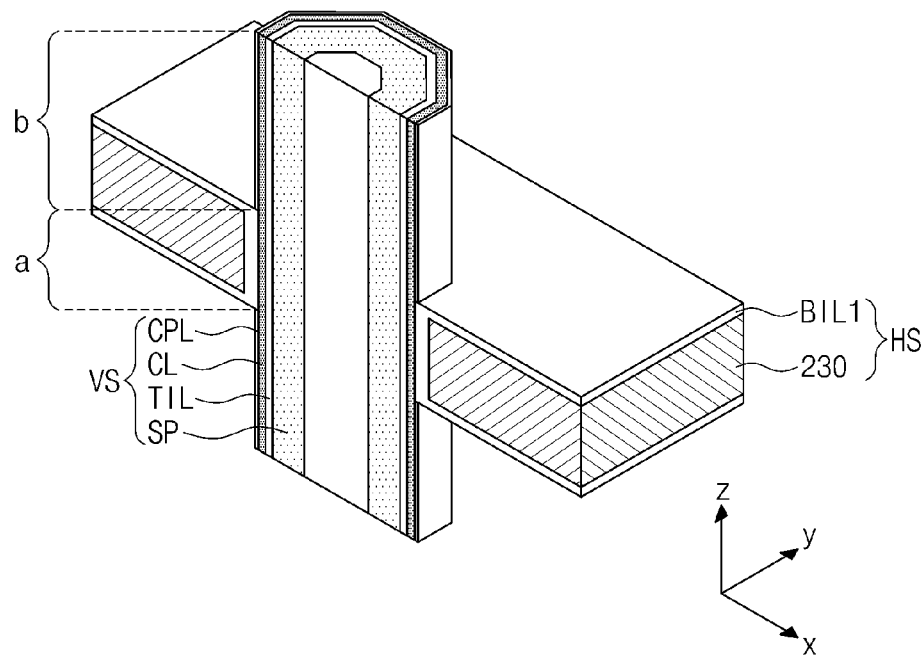

According to an embodiment, a sidewall thickness of the capping layer CPL may be non-uniform. For example, according to an embodiment, during the forming of the recess regions 210, portions of the sidewall of the capping layer CPL adjacent to the horizontal structures HS may be horizontally recessed. According to an embodiment, the capping layer CPL may be thicker at a region "b" (or a vertical adjacent region) between the horizontal structures HS than at a region "a" (or a channel region) adjacent to the horizontal structure HS as illustrated in FIG. 26. The vertical adjacent region b may be a region located between two adjacent channel regions a. Alternatively, the capping layer CPL may locally remain at the vertical adjacent region "b", and the horizontal structure HS may directly contact the sidewall of the charge storing layer CL at the channel region "a" as illustrated in FIG. 27. According to an embodiment, the sidewall thickness of the capping layer CPL may be substantially uniform as illustrated in FIG. 21.

Figure 28:
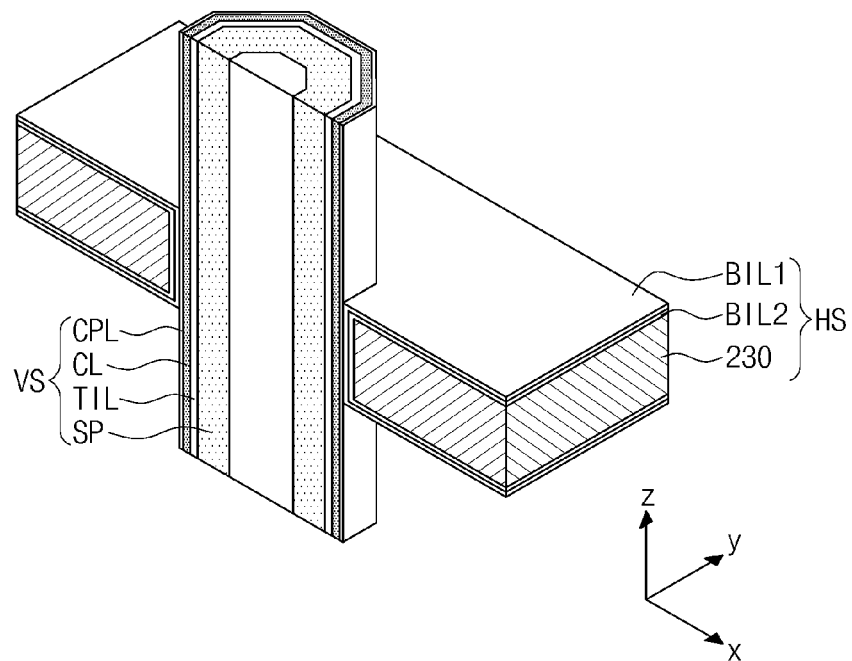

According to an exemplary embodiment, the horizontal structure HS may include both of the first and second blocking insulating layers BIL1 and BIL2 as illustrated in FIGS. 24, 25 and 28.

According to an embodiment, the charge storing layer CL may include one or more insulating layers with abundant trap sites and/or may include one or more insulating layers with nano particles. According to an embodiment, the charge storing layer CL may be formed, for example, by CVD and/or ALD. For example, according to an embodiment, the charge storing layer CL may include one of a trap insulating layer and/or an insulating layer with a floating gate electrode and/or conductive nano dots. According to an embodiment, the charge storing layer CL may include a silicon nitride layer, a silicon oxynitride layer, a silicon-rich nitride layer, a nano crystalline silicon layer, and/or a laminated trap layer.

The tunnel insulating layer TIL may be formed of a material with a higher band gap than a band gap of the charge storing layer CL by, for example, CVD and/or ALD. For example, according to an embodiment, the tunnel insulating layer TIL may include a silicon oxide layer. According to an embodiment, the tunnel insulating layer TIL may undergo a thermal treatment after a deposition process. According to an embodiment, the thermal treatment process may include, for example, a rapid thermal nitridation (RTN) process and/or an annealing process in an atmosphere including nitrogen and/or oxygen.

According to an embodiment, the first and second blocking insulating layers BIL1 and BIL2 may include different materials, and one of the first and second blocking insulating layers BIL1 and BIL2 may be formed of a material having a smaller band gap than a band gap of the tunnel insulating layer TIL and a larger band gap than a band gap of the charge storing layer CL. According to an embodiment, the first and second blocking insulating layers BIL1 and BIL2 may be formed by, for example, CVD and/or ALD. According to an embodiment, at least one of BIL1 and BIL2 may be formed by wet oxidation. According to an exemplary embodiment, the first blocking insulating layer BIL1 may include a high-k dielectric layer (e.g., an aluminum oxide layer and/or a hafnium oxide layer). The second blocking insulating layer BIL2 may be formed of, for example, a material with a smaller dielectric constant than the first blocking insulating layer BIL1. According to an exemplary embodiment, the second blocking insulating layer BIL2 may include a high-k dielectric layer, and the first blocking insulating layer BIL1 may be formed of a material with a smaller dielectric constant than the second blocking insulating layer BIL2. According to an exemplary embodiment, a third blocking insulating layer (not shown) may be included between the charge storing layer CL and the conductive pattern 230.

According to an embodiment, the capping layer CPL may include a material having an etch selectivity with respect to the charge storing layer CL and/or the sacrificial layer 130. For example, if the sacrificial layer 130 is a silicon nitride layer, the capping layer CPL may be a silicon oxide layer. During a process for removing the sacrificial layers 130 to form the recess regions 210, the capping layer CPL may function as an etch stop layer to prevent and/or reduce etch damage to the charge storing layer CL. According to an embodiment, in the case that the capping layer CPL may remain between the conductive pattern 230 and the charge storing layer CL as shown in FIGS. 21, 26, and 28, the capping layer CPL may be formed of a material that contributes to preventing leakage (e.g., back-tunneling) of charge stored in the charge storing layer CL. For example, according to an embodiment, the capping layer CPL may include one of a silicon oxide layer and a high-k dielectric layer.

FIGS. 29 through 34 are perspective views illustrating methods of fabricating three-dimensional semiconductor devices according to an embodiment of the inventive concept. For concise description, overlapping description of embodiments previously described with reference to FIGS. 2 through 11 may be omitted.

Figure 29:
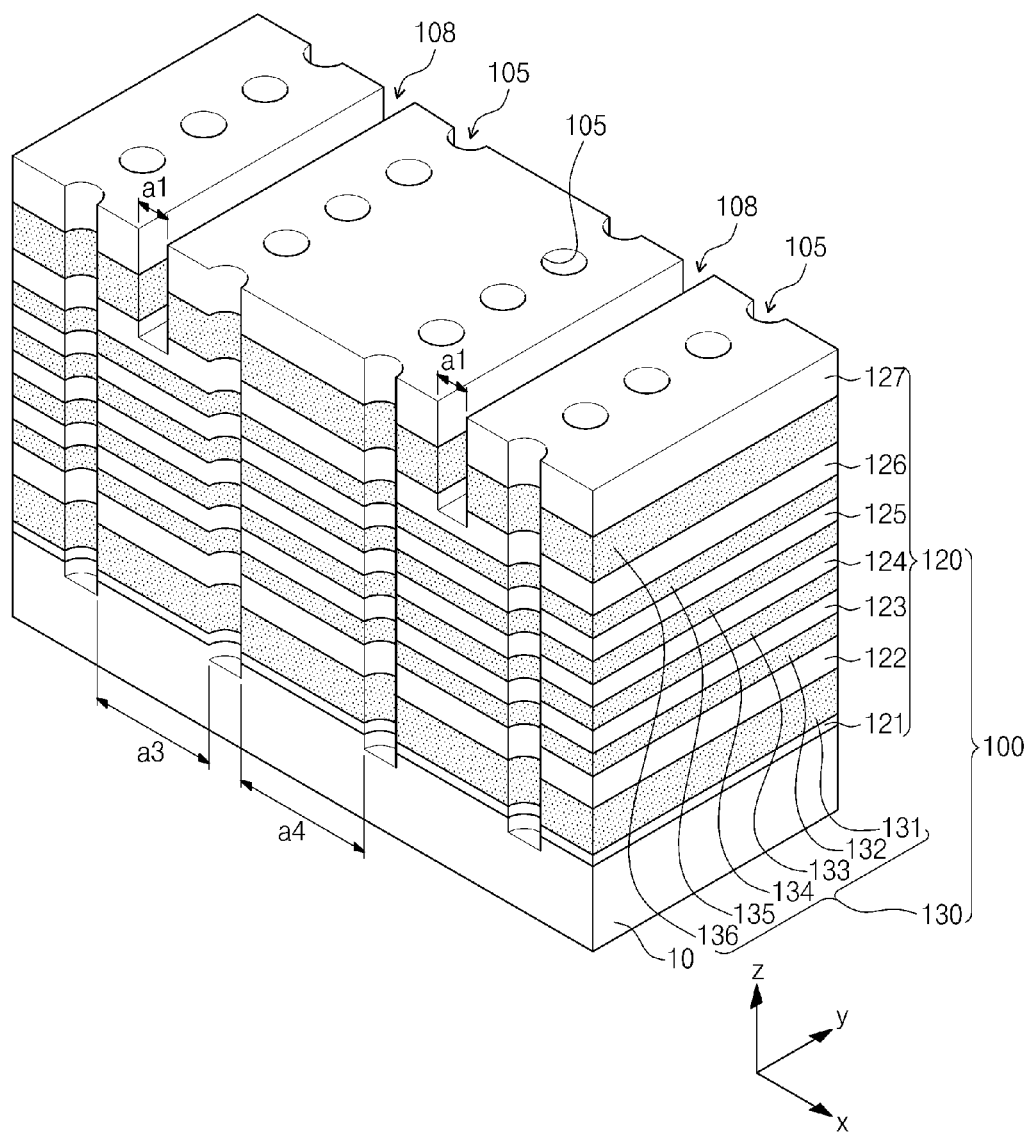

Referring to FIG. 29, channel holes 105 and first trenches 108 may be formed in the mold structure 100 described with reference to FIG. 2. The channel holes 105 and the first trenches 108 may be formed using different patterning processes from each other. The first trenches 108 may be formed by patterning at least one of the sacrificial layers 130. In comparison with the embodiments described with reference to FIGS. 2 through 20, the first trenches 108 may be formed to penetrate only some of the layers constituting the mold structure 100. For instance, according to an embodiment, during the formation of the first trenches 108, the uppermost sacrificial layer 136 of the sacrificial layers 130 may be patterned to define sidewalls of the first trenches 108, but the underlying sacrificial layers 131-135 may not be patterned. According to an embodiment, the uppermost two sacrificial layers 135 and 136 of the sacrificial layers 130 may be patterned, but the underlying sacrificial layers 131-134 may not be patterned. Methods of patterning the sacrificial layers 130 may be varied depending on functions of conductive layers, which will be substituted for the sacrificial layers 130. For instance, according to an embodiment, in the case that the uppermost sacrificial layer 136 is replaced by a gate electrode of a string selection transistor, the uppermost sacrificial layer 136 of the sacrificial layers 131-136 may be patterned. According to an embodiment, in the case that the uppermost two sacrificial layers 135 and 136 are replaced by gate electrodes of the string selection transistors, the uppermost two sacrificial layers 135 and 136 may be patterned.

Figure 30:
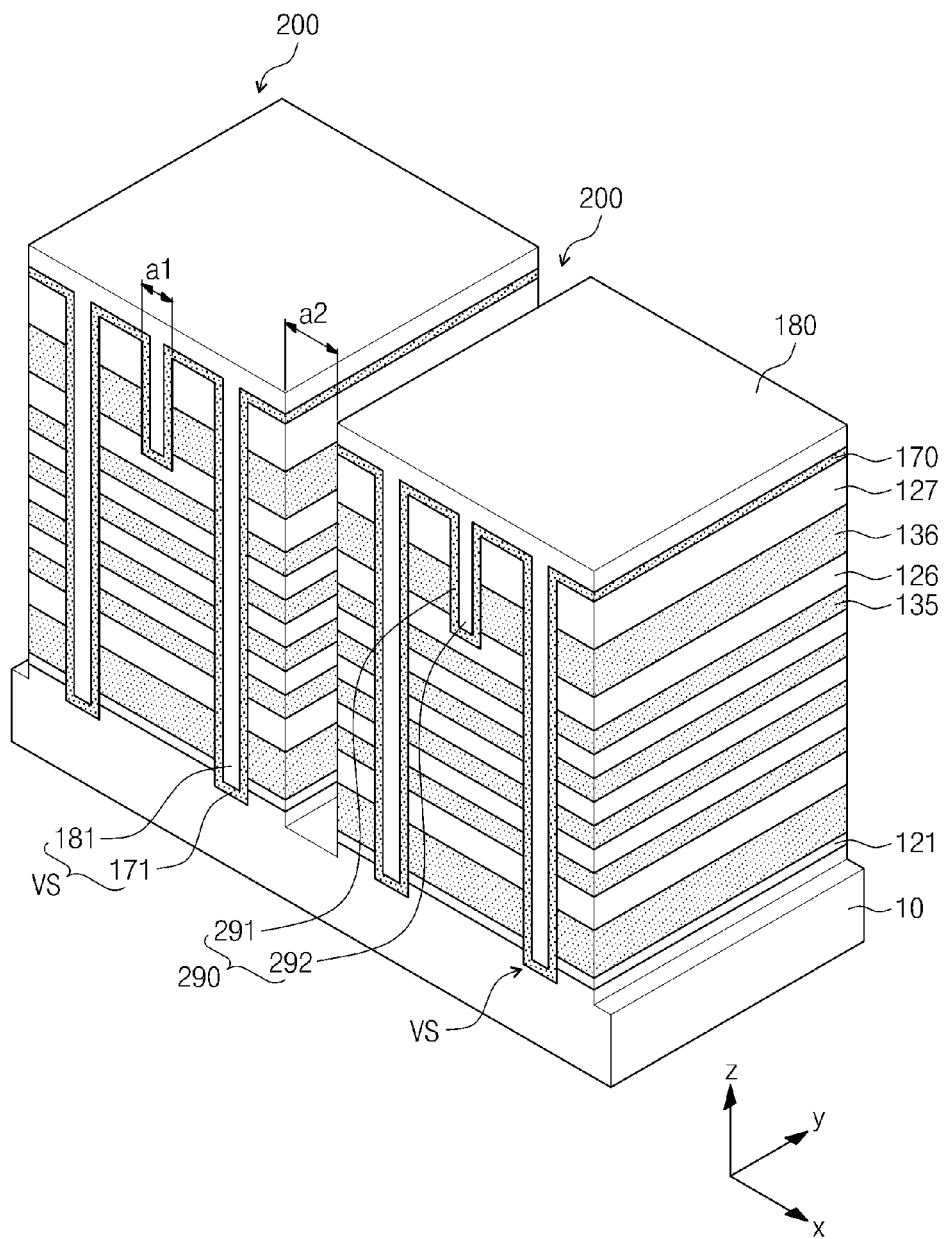

Referring to FIG. 30, the processes described with reference to FIGS. 4 through 6 may be performed to the mold structure 100 provided with the first trenches 108. As a result, a vertical semiconductor layer 171 and a vertical gap-fill layer 181 constituting a vertical pattern VS may be sequentially formed in the channel hole 105, and a separation semiconductor layer 291 and a separation insulating layer 292 constituting a separation pattern 290 may be sequentially formed in the first trench 108. A bottom surface of the separation pattern 290 may be spaced apart from the substrate 10 by some layers of the mold structure 100. As shown in FIG. 30, the mold structure 100 may be patterned to define second trenches 200 that expose the substrate 10.

Figure 31:
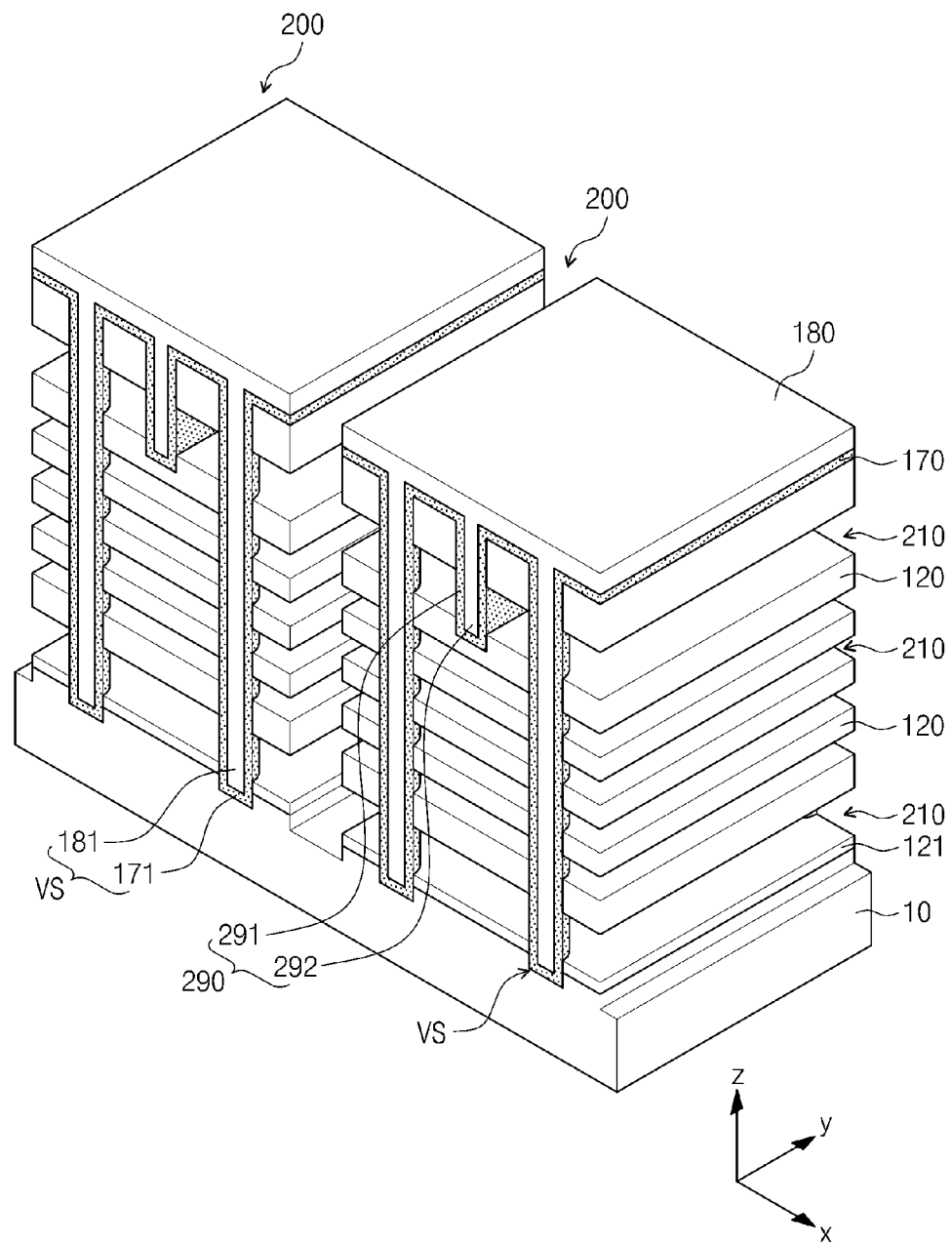

Referring to FIG. 31, the sacrificial layers 130 exposed by the second trenches 200 may be selectively removed to form recess regions 210. Portions of the sacrificial layers 130, which are interposed between the vertical structures VS and the separation pattern 290, can be etched out through portions of the recess region 210, which are positioned between the vertical structures VS arranged along the y-direction. For example, a wet etchant can be delivered from the second trench 200 to a sidewall of the separation pattern 290 through spaces between the y-directionally separated vertical structures VS. As a result, the portions of the sacrificial layer 130 interposed between the vertical structure VS and the separation pattern 290 can be fully removed during the formation of the recess regions 210. Further, the sacrificial layers 131-135 disposed below the separation patterns 290 can be removed by the wet etchant supplied through spaces between the y-directionally separated vertical structures VS. As a result, the recess regions 210 formed below the separation patterns 290 may be formed to connect two adjacent second trenches 200 to each other.

Figure 32:
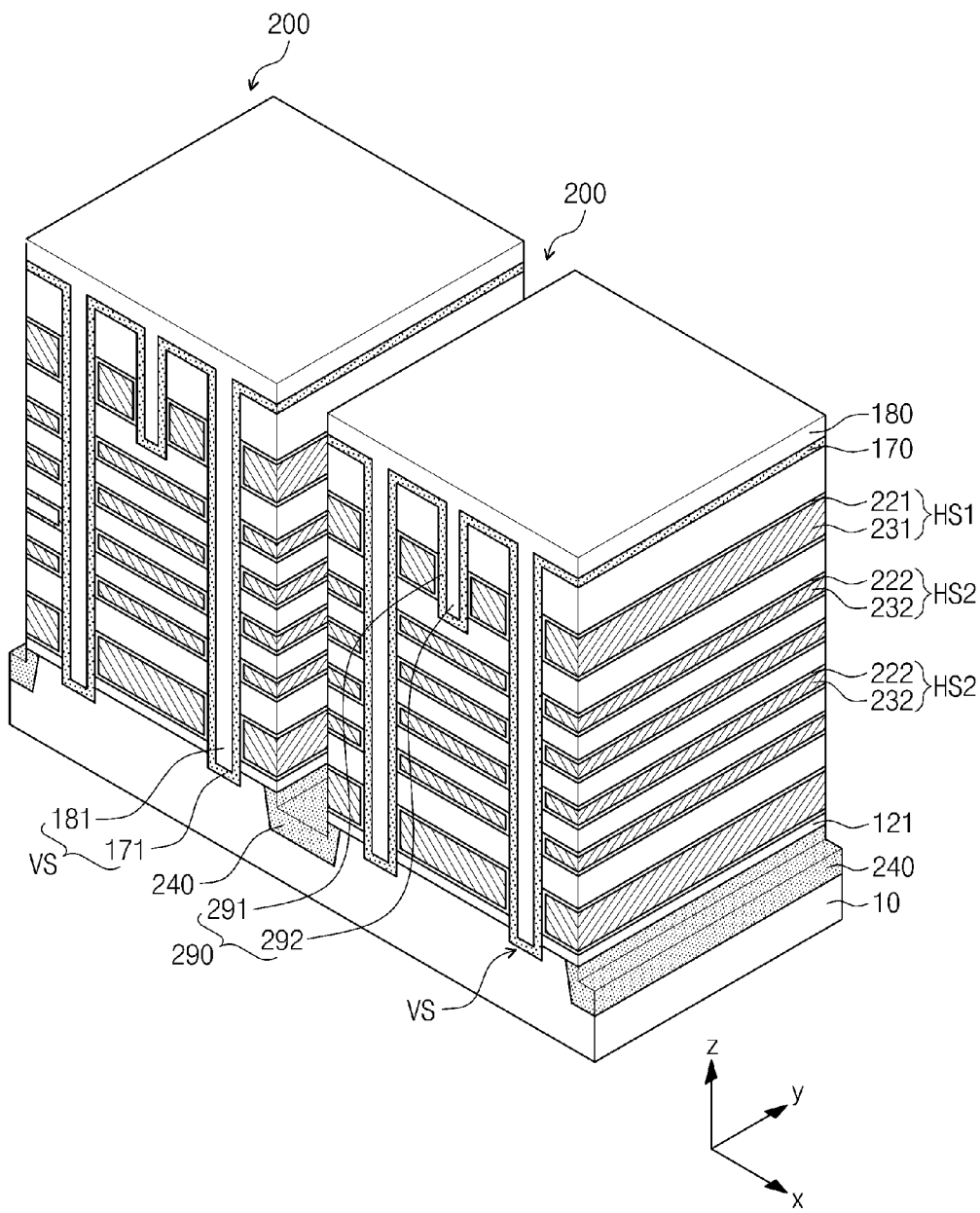

Referring to FIG. 32, horizontal structures HS may be formed to fill the recess regions 210. The horizontal structures HS may include first horizontal structures HS1 divided by the separation patterns 290 and second horizontal structures HS2 undivided by the separation patterns 290. According to an exemplary embodiment of the inventive concept, in the case that the semiconductor device is a FLASH memory, the first horizontal structures HS1 may include string selection lines, which may be completely divided from one another along the y-direction. For instance, according to an embodiment, bottom surfaces of the separation patterns 290 may be formed at a lower level than a bottom surface of the string selection line as shown in FIG. 32. This structure may also be applied to the three-dimensional semiconductor devices described with reference to FIGS. 2 through 20. The first horizontal structure HS1 may include a first memory layer 221 covering an inner wall of the recess region 210 and a first conductive pattern 231 filling the remaining space of the recess region 210. The second horizontal structure HS2 may include a second memory layer 222 covering an inner wall of the recess region 210 and a second conductive pattern 232 filling the remaining space of the recess region 210. The second horizontal structures HS2 may be formed below the separation patterns 290, and thus the two adjacent vertical structures VS may be directly connected with each other by the second horizontal structure HS2. According to an exemplary embodiment of the inventive concept, in the case that the semiconductor is a FLASH memory, third doped regions 240 may be further formed after the formation of the first and second horizontal structures HS1 and HS2.

Figure 33:
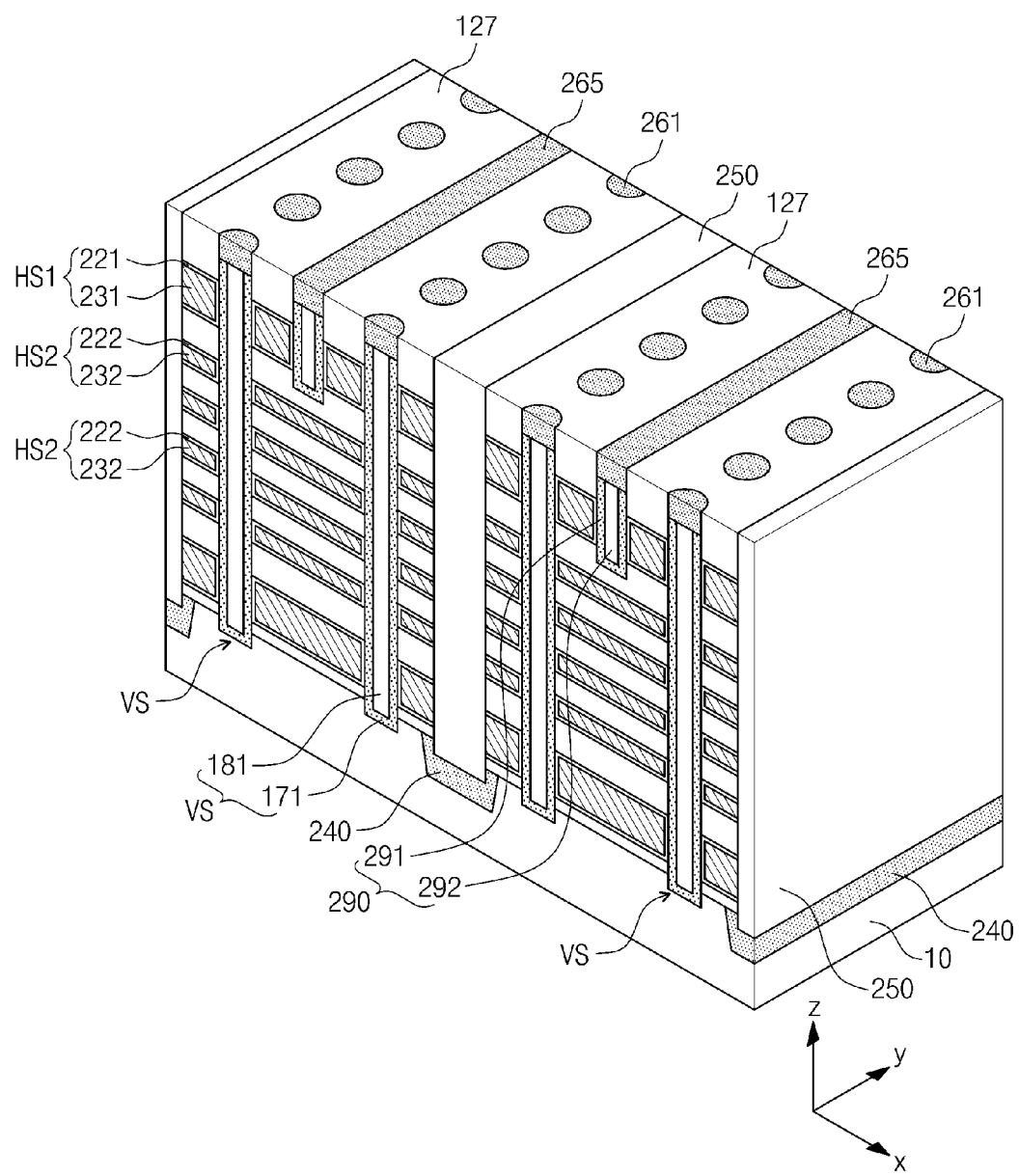

Referring to FIG. 33, gap-fill insulating patterns 250 may be formed to fill the second trenches 200. Fourth doped regions 261 and first doped regions 265 may be formed on the vertical structures VS and the separation patterns 290, respectively. According to an embodiment, the fourth and first doped regions 261 and 265 may have a different conductivity type from the substrate 10.

Figure 34:
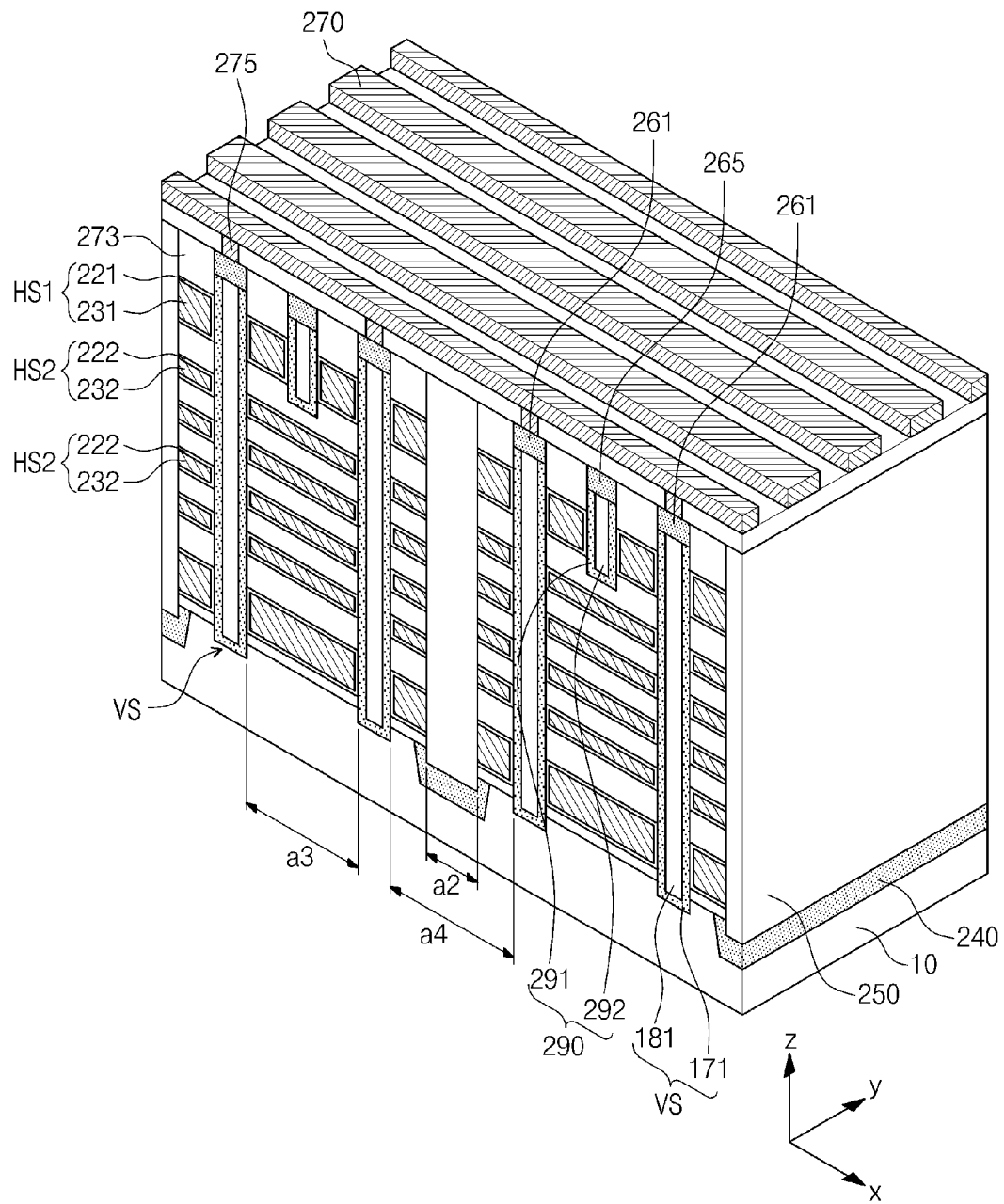

Referring to FIG. 34, upper plugs 275 may be formed through an interlayer dielectric 273 on the vertical structures VS, respectively, and upper lines 270 may be formed on the upper plugs 275 to connect the upper plugs 275 with each other.

Figure 35:
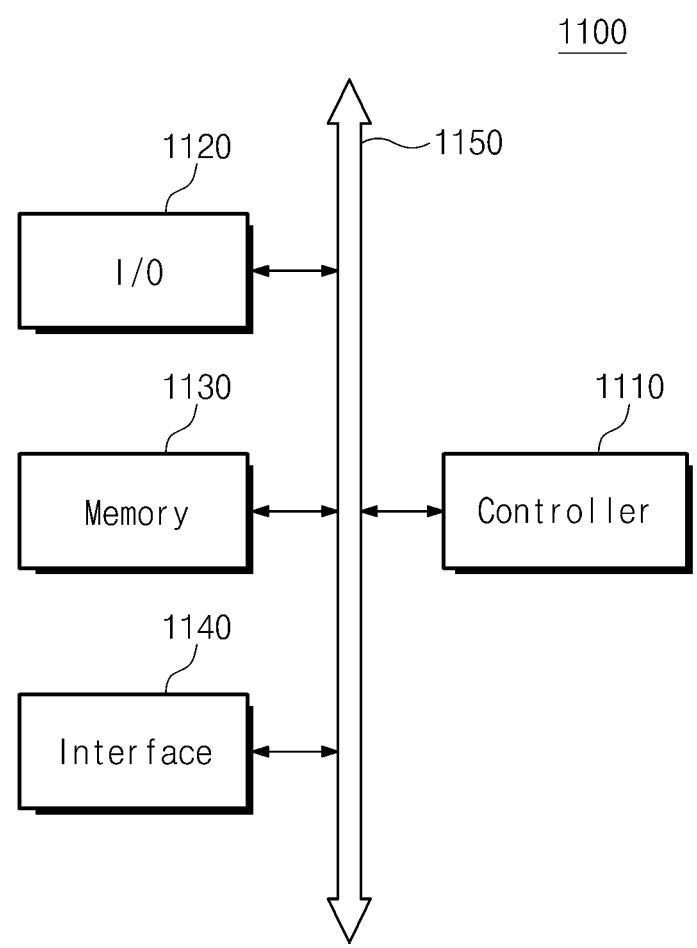

FIG. 35 is a schematic block diagram illustrating an example of a memory system including a semiconductor memory device according to an embodiment of the inventive concept.

According to an embodiment, a memory system 1100 can be applied to a personal digital assistant (PDA), a portable computer, a web tablet, a wireless phone, a mobile phone, a digital music player, a memory card and/or all the devices capable of transmitting and/or receiving data in a wireless communication environment.

Referring to FIG. 35, the memory system 1100 includes a controller 1110, an input/output (I/O) device 1120, such as a keypad and a display device, a memory 1130, an interface 1140, and a bus 1150. The memory 1130 and the interface 1140 communicate with each other through the bus 1150.

The controller 1110 includes at least a microprocessor, at least a digital signal processor, at least a microcontroller or other similar process devices. The memory 1130 may be used to store an instruction executed by the controller 1110. The I/O device 1120 can receive data or a signal from the outside of the system 1100 or transmit data or a signal to the outside of the system 1100. For example, the I/O device 1120 may include a keyboard, a keypad, and/or a display device.

The memory 1130 includes a nonvolatile memory device according to an embodiment of the inventive concept. The memory 1130 may further include various types of memories, such as a volatile memory device capable of random access.

The interface 1140 transmits data to a communication network (not shown) or receives data from a communication network (not shown).

Figure 36:
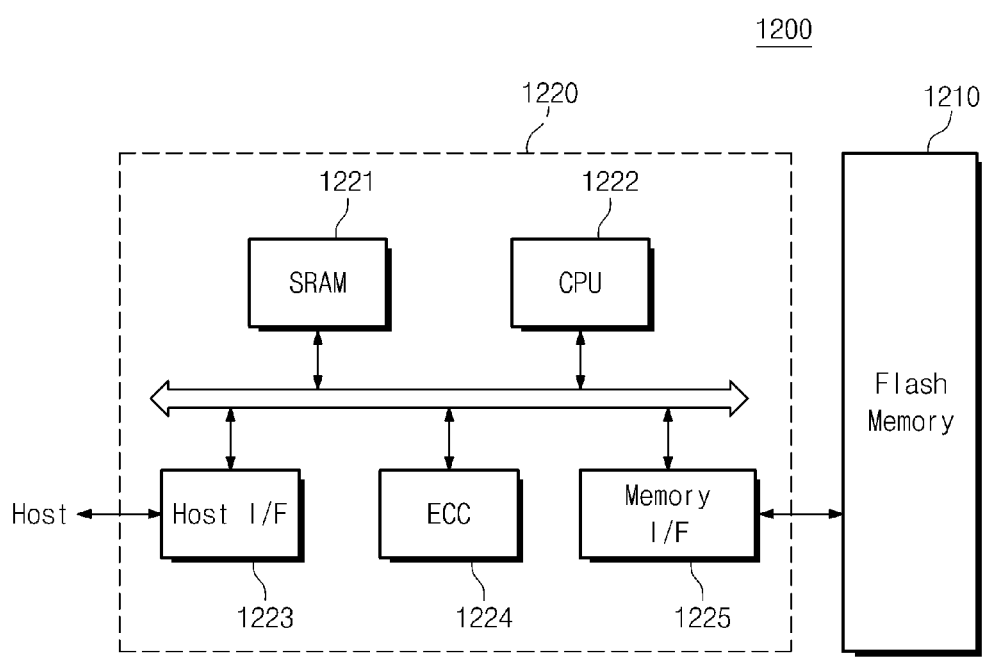

FIG. 36 is a block diagram illustrating an example of a memory card including a semiconductor memory device according to an embodiment of the inventive concept.

Referring to FIG. 36, the memory card 1200 for supporting high-capacity data storage includes a FLASH memory device 1210 according to an embodiment of the inventive concept. The memory card 1200 according to an embodiment of the inventive concept includes a memory controller 1220 that controls every data exchange between a host and the FLASH memory device 1210.

A static random access memory (SRAM) 1221 is used as an operation memory of a processing unit (also referred to as "CPU") 1222. A host interface 1223 includes data exchange protocols of a host to be connected to the memory card 1200. An error correction block (also referred to as "ECC") 1224 detects and corrects errors included in data readout from the multi-bit FLASH memory device 1210. A memory interface 1225 interfaces with the FLASH memory device 1210. The processing unit 1222 performs every control operation for exchanging data of the memory controller 1220. According to an embodiment, the memory card 1200 may further include a ROM (not shown) storing code data for interfacing with the host.

Figure 37:
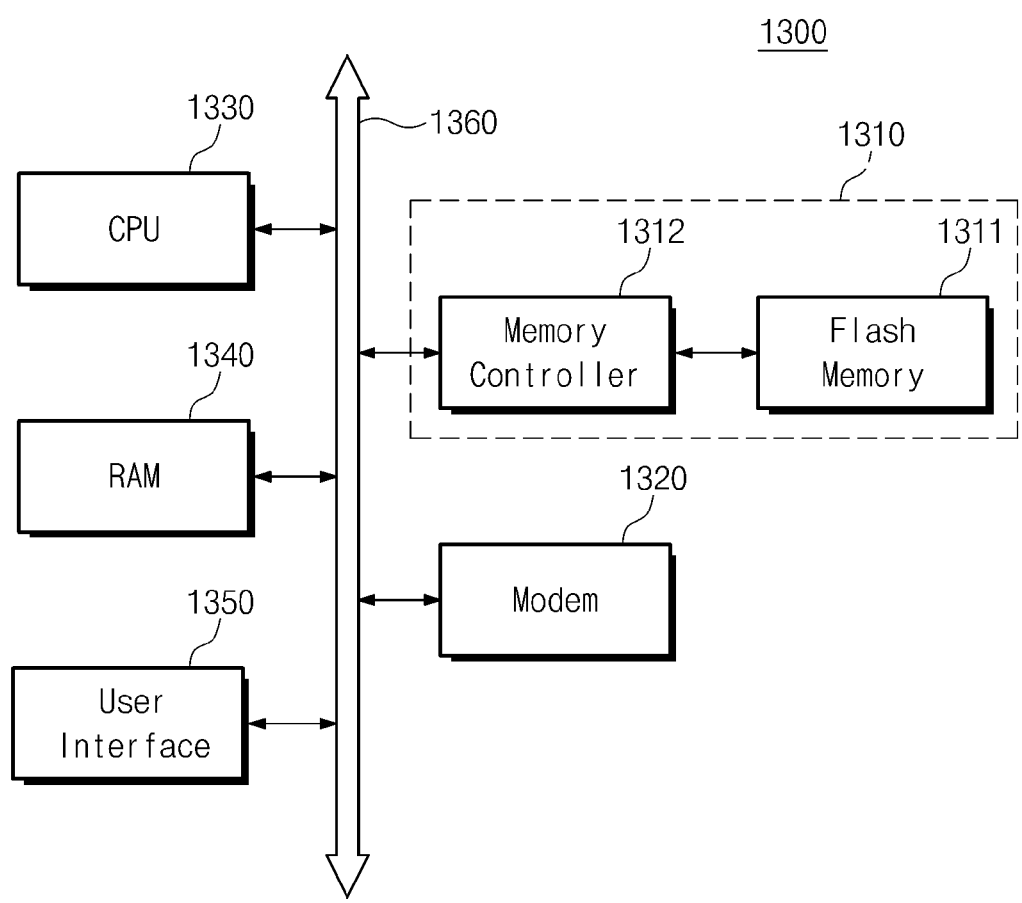

FIG. 37 is a block diagram illustrating an example of an information processing system including a semiconductor memory device according to an embodiment of the inventive concept.

Referring to FIG. 37, a FLASH memory system 1310 according to an embodiment of the inventive concept is built in a data processing system 1300, such as a mobile product or a desk top computer. The data processing system 1300 includes the FLASH memory system 1310 and a modem 1320, a central processing unit ("CPU") 1330, a RAM 1340, and a user interface 1350 that are electrically connected to a system bus 1360. The FLASH memory system 1310 may be to the same or substantially the same as the memory system or the FLASH memory system described above. The FLASH memory system 1310 stores data processed by the central processing unit 1330 or data inputted from an external device (not shown). The FLASH memory system 1310 may include a solid-state disc (SSD) so that the data processing system 1310 can stably store huge amounts of data in the FLASH memory system 1310. As reliability is improved, the FLASH memory system 1310 can reduce resources used to correct errors so that the data processing system 1300 can provide a high-speed data exchange function. According to an embodiment, the data processing unit 1300 may further include an application chipset, a camera image processor (CIS), and/or an input/output device.

The FLASH memory device or memory system according to the embodiments of the inventive concept can be mounted in various types of packages. For example, a FLASH memory device or a memory system according to an embodiment of the inventive concept can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multichip package (MCP), wafer-level fabricated package (WFP), wafer-level processed stack package (WSP) and mounted.

According to the exemplary embodiments of the inventive concept, three-dimensionally arranged electrodes may be horizontally separated by gap-fill insulating patterns and separation patterns that are alternately arranged. The separation patterns may have a smaller width than a width of the gap-fill insulating pattern, and thus it is possible to fabricate the three-dimensional semiconductor device having an increased integration density.

Furthermore, since the separation pattern may structurally support the mold structure 100, the removal of the sacrificial layers and the formation of the conductive patterns may be stably performed, compared with the absence of the separation pattern.

While exemplary embodiments have been particularly shown and described, it will be understood by one of ordinary skill in the art that variations in form and detail may be made therein without departing from the spirit and scope of the claims.

What is claimed is:

1. A three-dimensional semiconductor device, comprising:
a substrate;
gap-fill insulating patterns on the substrate;
an electrode structure defined by sidewalls of the gap-fill insulating patterns, wherein the electrode structure comprises electrodes and insulating layers alternately stacked;
vertical structures provided between adjacent gap-fill insulating patterns of the gap-fill insulating patterns to penetrate the electrode structure, the vertical structures including first and second rows of the vertical structures;
a separation pattern provided between the first and second rows of vertical structures, the separation pattern comprising a separation semiconductor layer; and
a first doped region having the same conductivity type as the substrate, the first doped region having a higher doping concentration than a doping concentration of the substrate, wherein the first doped region is provided in an upper portion of the substrate, wherein the first doped region is connected to a bottom surface of the separation pattern, wherein the first doped region has a line shape extending along the separation pattern, and
wherein the separation pattern extends along a direction parallel to the first and second rows of vertical structures, and wherein the separation semiconductor layer penetrates at least one of the electrodes.

2. The device of claim 1, wherein a width of the separation pattern is smaller than a width of the gap-fill insulating patterns.

3. The device of claim 1, wherein the vertical structures are provided in channel holes penetrating the electrode structure, wherein each of the vertical structures comprises a vertical semiconductor layer filling at least a portion of a corresponding channel hole.

4. The device of claim 3, wherein the separation pattern is provided in a first trench exposing the substrate along the direction parallel to the first and second rows of vertical structures, wherein the separation semiconductor layer fills at least a portion of the first trench.

5. The device of claim 1, wherein, as viewed from above the separation pattern, the separation pattern is shaped as circles partially overlapping each other along the direction parallel to the first and second rows of vertical structures.

6. The device of claim 1, further comprising a second doped region provided along the separation pattern on a top portion of the separation pattern.

7. The device of claim 6, wherein the second doped region has the same conductivity type as the first doped region.

8. The device of claim 7, further comprising:
a third doped region formed in the substrate under the gap-fill insulating pattern; and
a fourth doped region provided on a top portion of the vertical structure, wherein the first, second, third, and fourth doped regions have the same conductivity type.

9. The device of claim 3, further comprising a memory layer disposed between the electrode structure and the vertical structure.

10. The device of claim 9, wherein the memory layer is provided between the separation pattern and the electrodes and electrically separates the separation pattern from the electrodes.

11. The device of claim 9, wherein the separation pattern penetrates at least one of the electrodes and a bottom surface of the separation pattern is spaced apart from a top surface of the substrate.

12. The device of claim 9, wherein the electrodes comprise word lines and a gate electrode of a string selection transistor disposed on top of the word lines, wherein a bottom surface of the separation pattern is positioned at a lower level than a bottom surface of the gate electrode of the string selection transistor.

13. A three-dimensional semiconductor device, comprising:
electrodes sequentially stacked on a substrate;
vertical structures penetrating the electrodes, the vertical structures two-dimensionally arranged on the substrate;
separation patterns extending along a y-axis direction parallel to a top surface of the substrate, wherein each of the separation patterns comprises a separation semiconductor layer, wherein the separation semiconductor layer penetrates at least one of the electrodes;
gap-fill insulating patterns extending parallel to the separation patterns, wherein the separation patterns and the gap-fill insulating patterns are alternately disposed between the vertical structures disposed along an x-axis direction crossing the y-axis direction; and a doped region having the same conductivity type as the substrate, the doped region having a higher doping concentration than a doping concentration of the substrate, wherein the dosed region is provided in an upper portion of the substrate, wherein the first dosed region is connected to a bottom surface of the separation pattern, wherein the doped region has a line shape extending along the separation pattern.

14. The device of claim 13, wherein, a distance in the second direction between a separation pattern and a vertical structure that are adjacent to each other is less than a distance in the second direction between a gap-fill insulating pattern and a vertical structure that are adjacent to each other.

15. A semiconductor device comprising:
a substrate;
a plurality of horizontal structures sequentially stacked on a top surface of the substrate;
a row of vertical structures penetrating the horizontal structures in a z-axis direction perpendicular to the top surface of the substrate, wherein the vertical structures are spaced apart from each other in a y-axis direction parallel to the top surface of the substrate;
a separation semiconductor pattern penetrating the horizontal structures in the z-axis direction and extending to the substrate, wherein the separation semiconductor pattern extends in the y-axis direction;
a gap-fill insulating pattern penetrating the horizontal structures in the z-axis direction, wherein the gap-fill insulating pattern extends in the y-axis direction, and wherein the row of vertical structures, the separation semiconductor pattern, and the gap-fill insulating pattern are arranged in parallel to each other in an x-axis direction parallel to the top surface of the substrate and perpendicular to the y-axis direction; and a doped region having the same conductivity type as the substrate, the doped region having a higher doping concentration than a doping concentration of the substrate, wherein the doped region is provided in an upper portion of the substrate, wherein the doped region is connected to a bottom surface of the separation pattern, wherein the doped region has a line shape extending along the separation pattern.

16. The semiconductor device of claim 15, wherein the separation semiconductor pattern penetrates all of the horizontal structures.

17. The semiconductor device of claim 15, wherein the separation semiconductor pattern penetrates only a horizontal structure located farthest from the substrate.

18. The semiconductor device of claim 15, wherein each of the vertical structures includes a vertical semiconductor layer and a vertical gap-fill layer sequentially formed on an inner wall, and the separation semiconductor pattern includes a separation semiconductor layer and a separation insulating layer sequentially formed on an inner wall.

19. The semiconductor device of claim 15, wherein each of the vertical structures includes a vertical pattern, a spacer, a vertical semiconductor layer, and a vertical gap-fill layer sequentially formed on an inner wall, and the separation semiconductor pattern includes a vertical separation pattern, a spacer separation pattern, a separation semiconductor layer, and a separation insulating layer sequentially formed on an inner wall.

* * * * *